(12) United States Patent
Cheng et al.

(10) Patent No.: US 9,748,336 B2
(45) Date of Patent: Aug. 29, 2017

(54) SEMICONDUCTOR DEVICE INCLUDING DUAL-LAYER SOURCE/DRAIN REGION

(71) Applicant: International Business Machines Corporation, Armonk, NY (US)

(72) Inventors: Kangguo Cheng, Schenectady, NY (US); Robert H. Dennard, Croton-on-Hudson, NY (US); Zhen Zhang, Sollentuna (SE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/948,492

(22) Filed: Nov. 23, 2015

(65) Prior Publication Data

US 2017/0104065 A1    Apr. 13, 2017

Related U.S. Application Data

(63) Continuation of application No. 14/880,445, filed on Oct. 12, 2015.

(51) Int. Cl.
*H01L 21/336* (2006.01)
*H01L 29/08* (2006.01)
(Continued)

(52) U.S. Cl.
CPC ...... *H01L 29/0847* (2013.01); *H01L 21/0257* (2013.01); *H01L 21/02532* (2013.01);
(Continued)

(58) Field of Classification Search
CPC ............ H01L 29/0847; H01L 29/7848; H01L 21/02532; H01L 29/165; H01L 29/45;
(Continued)

(56) References Cited

U.S. PATENT DOCUMENTS

| 2007/0155073 A1* | 7/2007 | Goktepeli ....... H01L 21/823814 438/197 |
| 2011/0175152 A1* | 7/2011 | Booth, Jr. ............. H01L 21/845 257/306 |

(Continued)

OTHER PUBLICATIONS

Cheng et al., "Semiconductor Device Including Dual-Layer Source/Drain Region", U.S. Appl. No. 14/880,445, filed Oct. 12, 2015.
(Continued)

*Primary Examiner* — Phat X Cao
*Assistant Examiner* — Mohammad M Hoque
(74) *Attorney, Agent, or Firm* — Cantor Colburn LLP; Vazken Alexanian

(57) ABSTRACT

A semiconductor device includes a semiconductor substrate having a channel region interposed between a first active region and a second active region, and a gate structure formed on the channel region. A first dual-layer source/drain region is on the first active region and a second dual-layer source/drain region is on the second active region. The first and second dual-layer source/drain regions include stacked layers formed of different semiconductor materials. A first extension region is embedded in the first active region and a second extension region is embedded in the second active region.

9 Claims, 22 Drawing Sheets

CROSS-SECTION PARALLEL TO FIN

(51) Int. Cl.

| | |
|---|---|
| *H01L 29/66* | (2006.01) |
| *H01L 21/324* | (2006.01) |
| *H01L 21/225* | (2006.01) |
| *H01L 21/02* | (2006.01) |
| *H01L 29/165* | (2006.01) |
| *H01L 29/167* | (2006.01) |
| *H01L 29/45* | (2006.01) |
| *H01L 29/78* | (2006.01) |

(52) U.S. Cl.
CPC ........ *H01L 21/2251* (2013.01); *H01L 21/324* (2013.01); *H01L 29/165* (2013.01); *H01L 29/167* (2013.01); *H01L 29/45* (2013.01); *H01L 29/665* (2013.01); *H01L 29/66795* (2013.01); *H01L 29/7848* (2013.01)

(58) Field of Classification Search
CPC ... H01L 21/324; H01L 29/665; H01L 29/167; H01L 21/2251; H01L 21/0257; H01L 29/66795

USPC .......................................... 438/283; 257/347
See application file for complete search history.

(56) References Cited

U.S. PATENT DOCUMENTS

| | | | |
|---|---|---|---|
| 2012/0193710 A1* | 8/2012 | Cheng | H01L 21/26513 257/337 |
| 2012/0261754 A1* | 10/2012 | Cheng | H01L 29/66772 257/347 |
| 2014/0035000 A1* | 2/2014 | Ontalus | H01L 29/665 257/192 |
| 2014/0061734 A1* | 3/2014 | Basker | H01L 29/66795 257/288 |

OTHER PUBLICATIONS

List of IBM Patents or Patent Applications Treated as Related; (Appendix P), Filed Jan. 28, 2016; 2 pages.

* cited by examiner

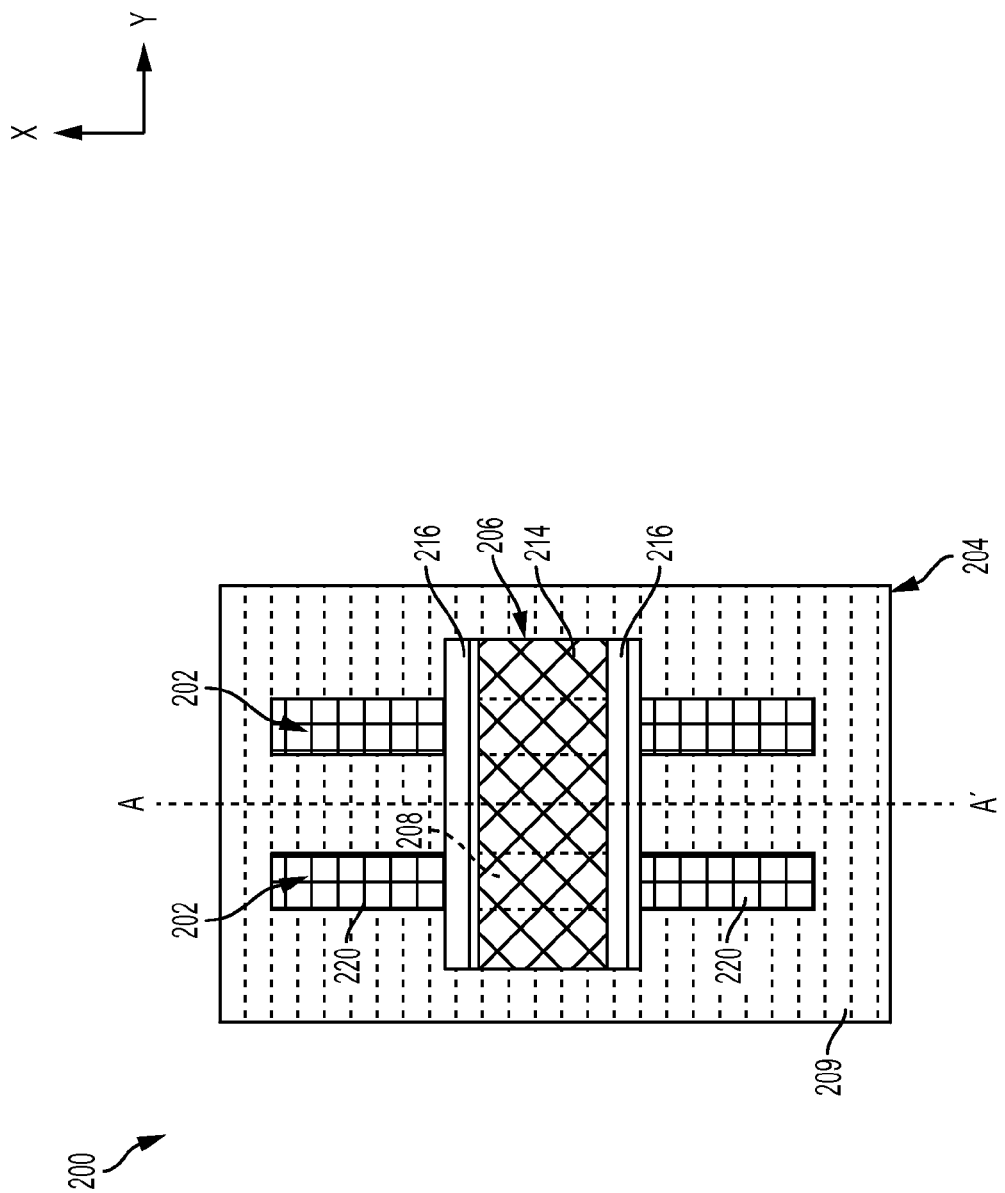

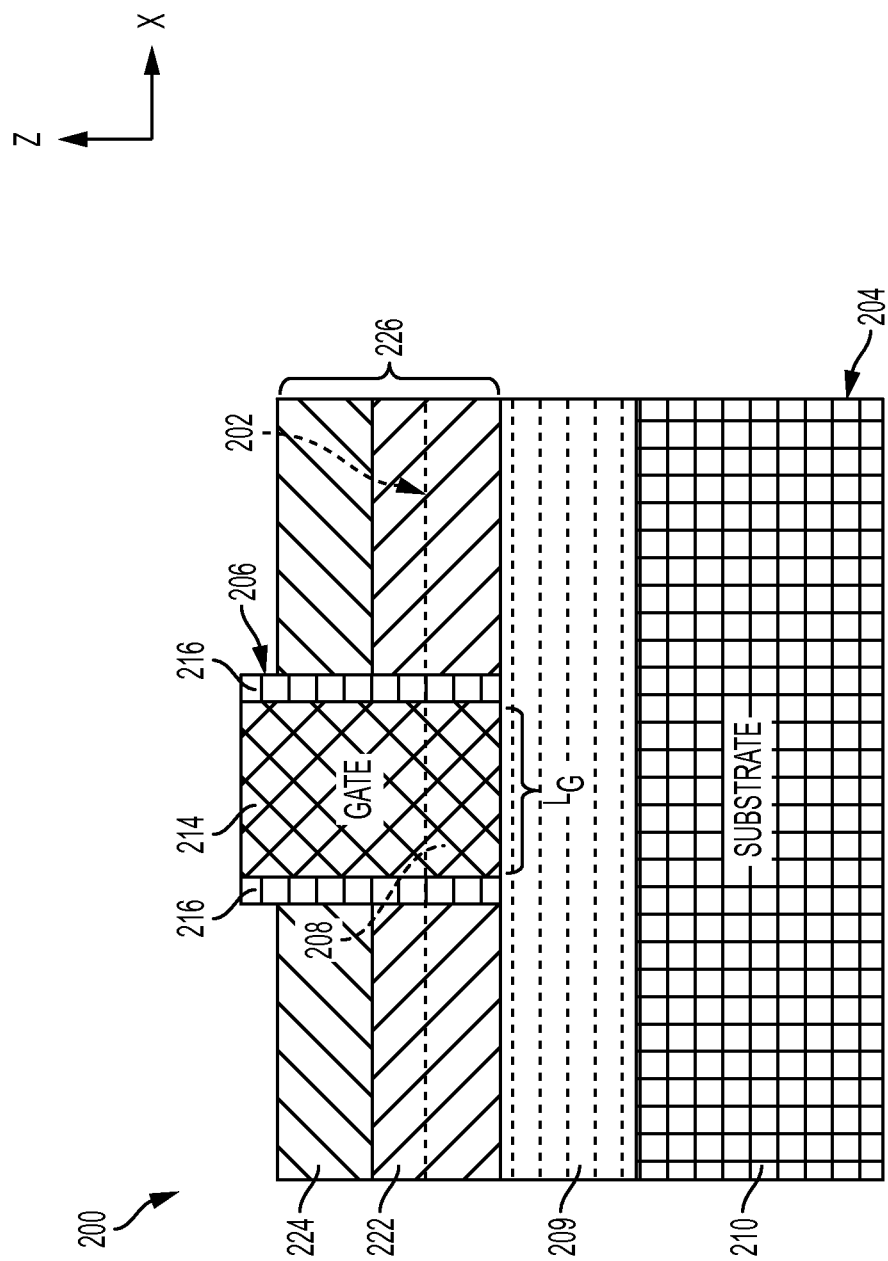

CROSS-SECTION PARALLEL TO FIN

SEMICONDUCTOR DEVICE INCLUDING DUAL-LAYER SOURCE/DRAIN REGION

DOMESTIC PRIORITY

This application is a continuation of U.S. patent application Ser. No. 14/880,445, filed Oct. 12, 2015, the disclosure of which is incorporated by reference herein in its entirety.

BACKGROUND

The present invention relates generally to semiconductor devices, and more specifically, to semiconductor devices having reduced source/drain contact resistance.

Recent semiconductor fabrication methods have been developed to introduce silicon germanium (SiGe) material into semiconductor devices, especially in p-type field effect transistor devices typically referred to as pFETs. The SiGe material is typically grown from an active layer of the semiconductor substrate reserved for the source/drain regions and allows for increased carrier mobility therethrough compared to pure silicon (Si). Accordingly, forming the source/drain regions of the pFET from SiGe can reduce the resistance at the source/drain regions thereby improving the overall performance of the device.

In addition to the carrier mobility enhancements provided by SiGe, recent trends in semiconductor manufacturing techniques have led to utilizing dopants typically included in the SiGe material to form extension regions in the underlying active semiconductor layer. Turning to FIG. 1, for example, a conventional semiconductor device 10 is illustrated. The conventional semiconductor device includes a semiconductor-on-insulator (SOI) substrate 12 and a gate structure 14 formed on an active layer 16 of the SOI substrate 12. Single-layer SiGe source/drain regions 18 are formed on an upper surface of the active layer 16 located adjacent opposing sides of the gate structure 14.

As illustrated in FIG. 2, the substrate 12 is exposed to a thermal anneal process such that dopants such as boron (B), for example, included in the single-layer SiGe source/drain regions 18 are driven into the underlying active layer 16. It has been discovered that some dopants such as boron diffuse from SiGe at a much slower rate compared to the diffusion of dopants from a pure semiconductor material such as silicon (Si), for example. The slow diffusion rate typically has a high thermal budget (high annealing temperature and/or long anneal time) results in the formation of gradient-shaped extension regions 20 (dopant gradient is greater than 5 nm/decade) within the active semiconductor layer 16. These gradient-shaped extension regions 20 are defined by the non-uniform step-like junctions that are located beneath the gate structure 14 as further illustrated in FIG. 2.

SUMMARY

According to at least one non-limiting embodiment of the present invention, a method of fabricating a semiconductor device comprises forming a gate structure on an upper surface of a semiconductor substrate. The semiconductor substrate includes first and second active regions adjacent to opposing sides of the gate structure. The method further comprises forming a first dual-layer source/drain region on an upper surface of the first active region, and forming a second dual-layer source/drain region on an upper surface of the second active region. The first and second dual-layer source/drain regions include first dopants therein. The method further includes annealing the first and second dual-layer source/drain regions such that the first dopants diffuse into the first and second active regions, respectively, to form first and second extension regions.

According to another non-limiting embodiment, a semiconductor device includes a semiconductor substrate having a channel region interposed between a first active region and a second active region, and a gate structure formed on the channel region. A first dual-layer source/drain region is on the first active region and a second dual-layer source/drain region is on the second active region. The first and second dual-layer source/drain regions include stacked layers formed of different semiconductor materials. A first extension region is embedded in the first active region and a second extension region is embedded in the second active region.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 3-8 are a series of views illustrating a method of forming a planar-type semiconductor device according to a non-limiting embodiment of the present teachings, in which:

FIG. 3 illustrates an intermediate planar-type semiconductor device including a gate structure formed atop a semiconductor-on-insulator (SOI) substrate;

FIG. 4 illustrates the semiconductor device of FIG. 3 following a first epitaxy process to form a first conductive layer on the active region of the SOI substrate located at opposing sides of the gate structure;

FIG. 5 illustrates the semiconductor device of FIG. 4 following a second epitaxy process that forms facet-shaped conductive layers on an upper surface of the first conductive layers so as to form dual-layer source/drain regions;

FIG. 6 illustrates the semiconductor device of FIG. 5 undergoing an anneal process that diffuses dopants from the first conductive layer into the underlying active semiconductor layer of the SOI substrate;

FIG. 7 illustrates the semiconductor device of FIG. 6 following diffusion of the first conductive layer dopants into the active semiconductor layer to form extension regions having sharp and abrupt junctions that extend beneath the gate structure; and FIG. 8 illustrates the semiconductor device of FIG. 7 following deposition of a silicide film that conforms to the upper surface of the facet-shaped conformal layers.

FIGS. 9A-15 are a series of views illustrating a method of forming a fin-type semiconductor device according to a non-limiting embodiment of the present teachings, in which:

FIG. 9A illustrates an intermediate fin-type semiconductor device including a plurality of semiconductor fins formed atop a SOI substrate and a gate structure that structure that wraps around the channel regions of the fins;

FIG. 10 illustrates the fin-type semiconductor device of FIG. 9B following a first epitaxy process to grow a first conductive layer from active regions of the semiconductor fins located at opposing sides of the gate structure;

FIG. 11A illustrates the fin-type semiconductor device of FIG. 10 in a first cross-sectional orientation following a second epitaxy process that forms a second conductive layer on an upper surface of the first conductive layers so as to form dual-layer source/drain regions on the fins;

FIG. 12 illustrates the fin-type semiconductor device shown in FIG. 11C undergoing an anneal process that diffuses dopants from the first conductive layer into the underlying active regions of the fin;

FIG. 14 illustrates the fin-type semiconductor device of FIG. 13 in the cross-sectional first orientation following deposition of a silicide film on an upper surface of the second conductive layer; and FIG. 15 illustrates the fin-type semiconductor device of FIG. 14 in the first cross-sectional orientation following a replacement metal gate (RMG) process to replace the gate stack with a conductive gate stack including a gate dielectric layer interposed between a gate electrode and the semiconductor substrate.

DETAILED DESCRIPTION

Figure 1:
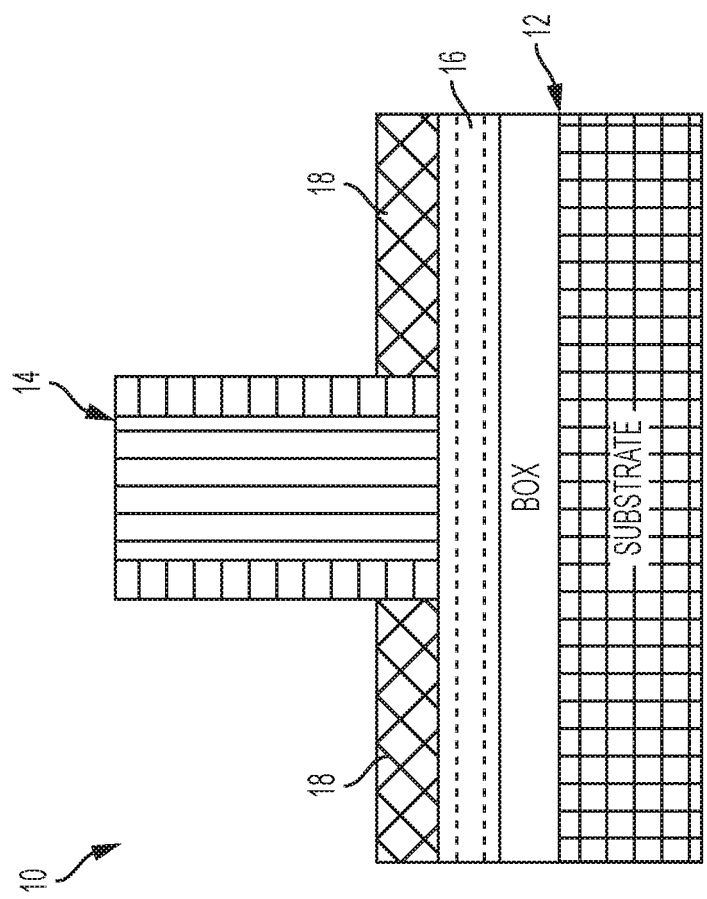
FIG. 1 illustrates a conventional semiconductor device including single-layer doped SiGe source/drain regions.
Figure 2:
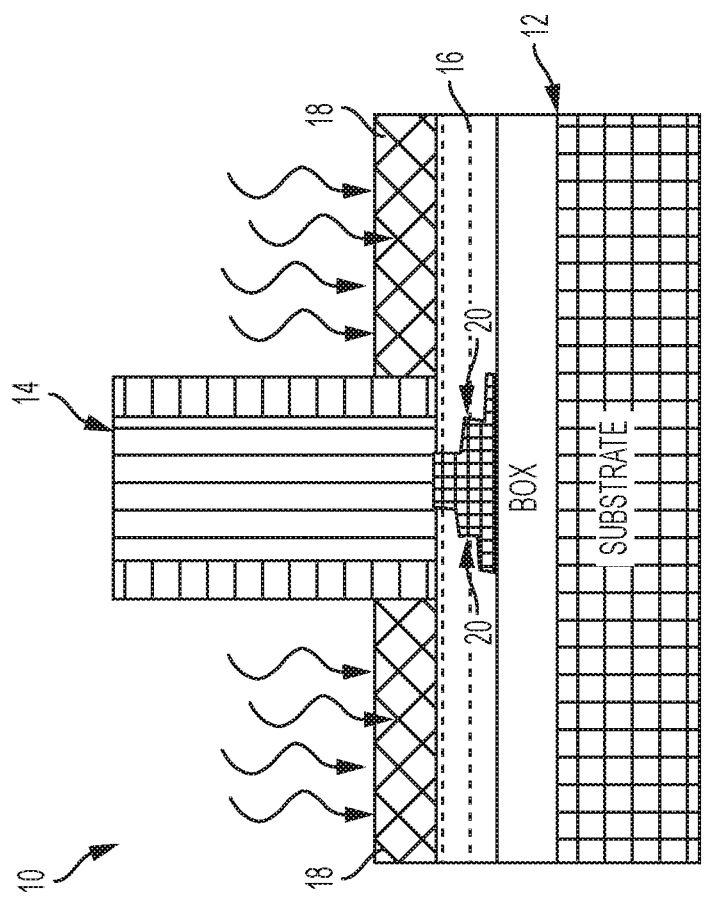
FIG. 2 illustrates the conventional semiconductor device of FIG. 1 undergoing a thermal anneal process that drives the dopants from the SiGe source/drain regions into the underlying active regions thereby forming gradient-shaped extension regions.

Conventional semiconductor devices employ single-layer source/drain regions typically formed from doped SiGe to improve carrier mobility and reduce overall source/drain region resistance. When annealing the SiGe source/drain region to drive the dopants from the SiGe into the underlying active semiconductor region, some dopants such as boron diffuse from SiGe at a slower rate compared to silicon (Si). As a result, a gradient-shaped source/drain junction profile is created as opposed to a sharp, abrupt junction profile. This gradient-shaped junction profile degrades short-channel control and undesirably increases source/drain extension resistance.

Unlike the conventional semiconductor devices employing single-layer SiGe source/drain regions, various non-limiting embodiments provide a semiconductor device having epitaxially grown dual-layer source/drain regions that increases carrier mobility while providing a non-gradient sharp and abrupt junction profile. In this manner, the dual-layer source/drain regions provided by at least one embodiment improves short-channel control and reduces source/drain extension resistance compared to the conventional semiconductor devices.

At least one non-limiting embodiment forms dual-layer source/drain regions having different materials that provide different dopant diffusion rates. A first conductive layer (e.g., lower conductive layer) is formed of a semiconductor layer such as silicon (Si), for example. The lower conductive layer is in-situ doped with an impurity such as boron (B), for example, and is grown atop an active region of a semiconductor substrate. A second conductive layer (e.g., upper conductive layer) is formed of a heterojunction material such as silicon germanium (SiGe), for example. The upper conductive layer is in-situ doped with an impurity such as boron (B) for example, and is grown on an upper surface of the lower conductive layer.

The materials of the lower and upper conductive materials control the diffusion of impurities at different rates. When exposed to an anneal process, for example, the diffusion rate of dopants (e.g., boron) within the pure semiconductor material (e.g., Si) of the lower conductive layer is faster than the diffusion rate of the dopants (e.g., boron) within the heterojunction material (e.g., SiGe). In this manner, the doped lower conductive layer can serve as a dopant-source for doping the underlying active semiconductor region located beneath the dual-layer source/drain regions. The faster diffusion rate of dopants (e.g., boron) provided by the lower conductive layer (e.g., Si) results in the formation of a sharp and abrupt (i.e., non-gradient) extension regions within the active semiconductor layer following the anneal process. It should be appreciated that the terms sharp and abrupt can be interchanged throughout the detailed description. Accordingly, short-channel control is improved and the source/drain extension resistance is decreased compared to the conventional semiconductor devices.

Figure 3:
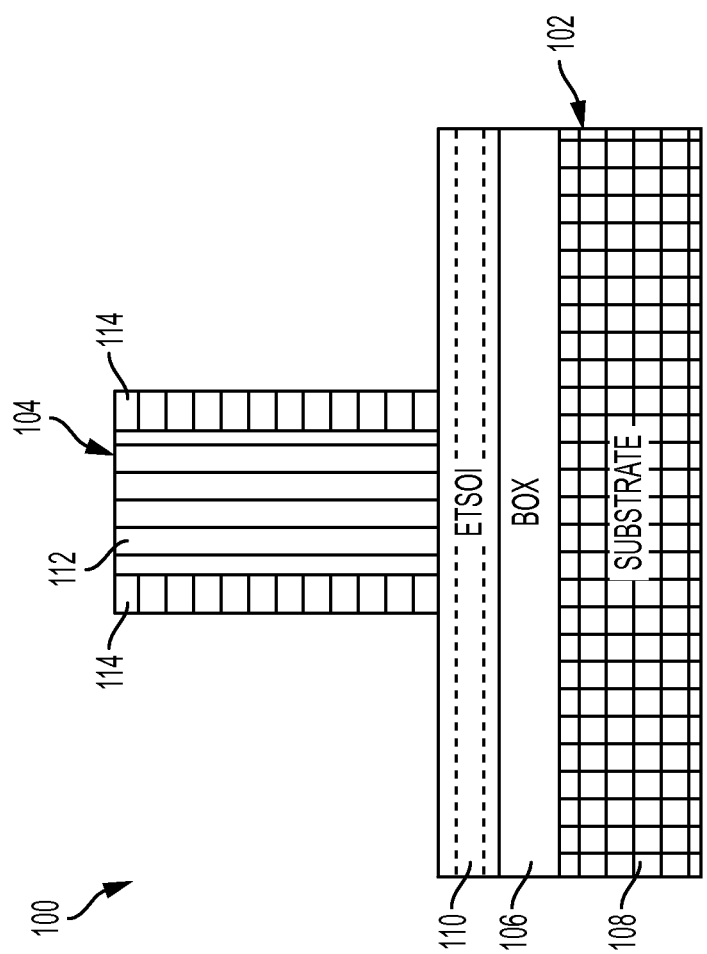

With reference now to FIG. 3, an intermediate planar-type semiconductor device 100 is illustrated according to a non-limiting embodiment. In the present specification and claims, an "intermediate" semiconductor device is defined as a semiconductor device in a stage of fabrication prior to a final stage. The intermediate planar-type semiconductor device 100 includes a SOI substrate 102 and a gate structure 104. The SOI substrate 102 includes a buried insulator layer 106 interposed between a bulk substrate layer 108 and an active semiconductor layer 110. The buried insulator layer 106 includes a buried oxide (BOX) layer formed from, for example, silicon dioxide ($SiO_2$). The thickness of the buried insulator layer 106 ranges, for example, from approximately 5 nanometers (nm) to approximately 200 nm. The bulk substrate layer 108 and the active semiconductor layer 110 are each formed from a semiconductor material such as Si, for example. The active semiconductor layer 110 may include an extremely thin semiconductor-on-insulator (ET-SOI) layer 110 having a thickness ranging, for example, from approximately 2 nm to approximately 12 nm.

The gate structure 104 includes a gate stack 112 and spacers 114 formed on opposing sidewalls of the gate stack 112. The gate stack 112 is formed from a gate material such as polysilicon (PolySi), for example, and is formed a gate stack 112 formed using various patterning techniques. For instance, a hard mask layer (not shown) may be initially deposited on an upper surface of the active semiconductor layer 110, and subsequently patterned to form a gate trench (not shown). The gate trench exposes a portion of the underlying active semiconductor layer 110 so as to define a gate channel of the semiconductor device 100. The gate trench may then be filled with a gate material 112, and the hardmask layer subsequently removed to form the gate stack 112 atop the channel region of the active semiconductor layer 110 as further illustrated in FIG. 3. The gate material 112 may comprise various materials including, but not limited to, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate material 112 may further comprise dopants that are incorporated during or after deposition.

While the gate stack 112 is shown as a single rectangular structure, it should be appreciated that the gate stack 112 may be composed of multiple materials and/or layers. For example, the gate stack 112 may include a nitride cap (not shown) formed from silicon nitride (SiN), for example, and may be formed atop a gate dielectric layer (not shown) formed various material including, but not limited to, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum. In this manner, the gate dielectric layer is interposed between the gate material 112 and the active semiconductor layer 110 of the SOI substrate 102. Other variants of the materials and ordering of the layers are also acceptable so that the upper surface of the gate stack 112 has sufficient stopping (etch or CMP) properties. The overall height of the gate may range from 20 nm to 100 nm, for example.

The spacers 114 are formed following formation of the gate stack 112. According to a non-limiting embodiment, a conformal spacer layer (not shown) formed of a dielectric material such as, for example, silicon nitride (SiN), silicon oxide, SiBCN, SiOCN, or any suitable combination of those materials, is deposited on the upper surface of the active semiconductor layer 110 so as to conform to the sidewalls and upper surface of the gate stack 112. Thereafter, an etching process such as a directional reactive ion etch (RIE), for example, that is selective to material of the active semiconductor layer 110 (e.g., Si) is performed. In this manner, the conformal spacer layer is removed from portions of the active semiconductor layer 110 and the upper surface of the gate stack 112 while spacers 114 are left remaining on opposing sidewalls of the gate stack 112 as further illustrated in FIG. 3. It should be appreciated that the gate structure 104 may include the gate stack 112 and the spacers 114.

Figure 4:
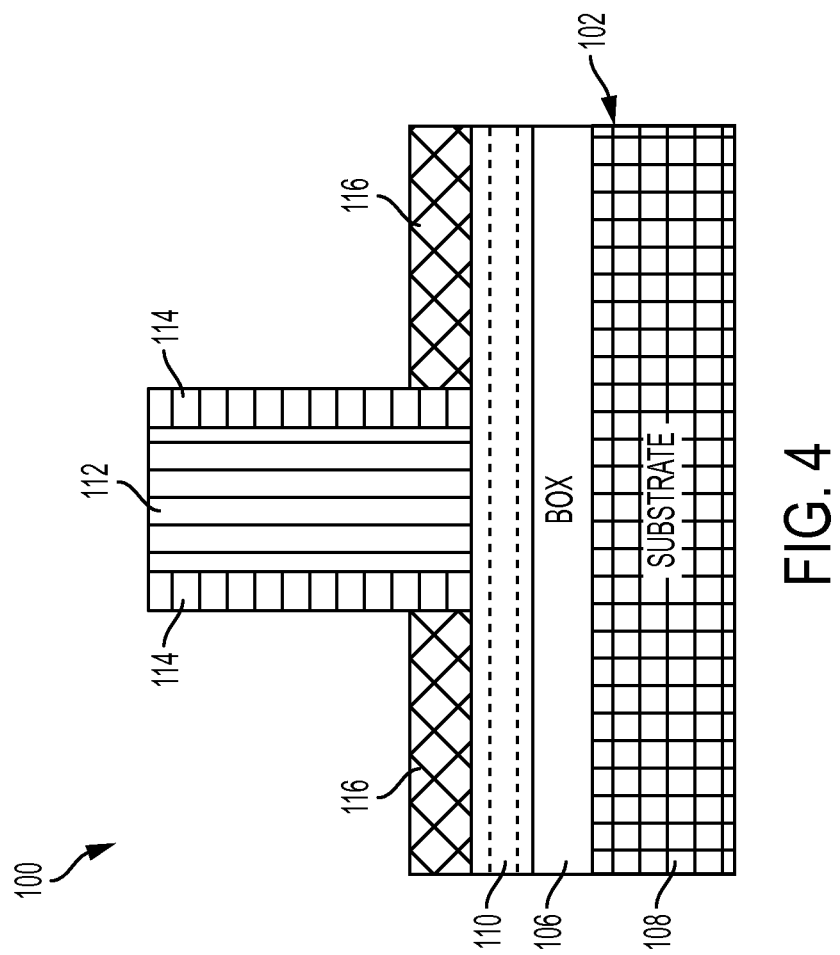

Turning now to FIG. 4, the semiconductor device 100 is illustrated after forming first conductive layers 116 on respective exposed portions of the active semiconductor layer 110. The exposed areas of the semiconductor device 100 are reserved for the formation of dual-layer source/drain regions as discussed in greater detail below. Each first conductive layer 116 is an in-situ doped semiconductor material, and is epitaxially grown from the exposed upper surfaces of the active semiconductor layer 110. When fabricating a p-type semiconductor device (e.g., pFET), in-situ doped silicon (Si) is epitaxially grown from the active semiconductor layer 110. When fabricating an n-type semiconductor device (e.g., nFET), in-situ doped silicon germanium (SiGe) is epitaxially grown from the active semiconductor layer 110. The epitaxy process used to grow the first conductive layers 116 may be carried out using various techniques including, but not limited to, chemical vapor deposition (CVD), vapor phase epitaxy (VPE), molecular beam epitaxy (MBE) or liquid phase epitaxy (LPE) with a gaseous or liquid precursor, such as, for example, silicon tetrachloride. Since the epitaxy process interacts only with semiconductor material, the first conductive layers 116 are not formed on the gate stack 112 or the spacers 114 as understood by one of ordinary skill in the art.

The thickness (i.e., vertical height) of the first conductive layer 116 ranges from approximately 3 nm to approximately 15 nm. In cases where pFET is fabricated, Si in-situ doped with boron (B), for example, is epitaxially grown from the active semiconductor layer 110 as boron diffuses from Si faster than from SiGe. The boron concentration of the first conductive layer 116 ranges, for example, from $1\times10^{19}/cm^3$ to $2\times10^{21}/cm^3$. In cases where an nFET is fabricated, SiGe in-situ doped with phosphorus (P) or arsenic (As), for example, is epitaxially grown from the active semiconductor layer 110 as both P and As diffused from SiGe faster than from Si. The phosphorus concentration of the first conductive layer 116 ranges, for example, from $1\times10^{19}/cm^3$ to $2\times10^{21}/cm^3$. According to a non-limiting embodiment, the first conductive layer 116 preferably has a flat and uniform upper surface as further illustrated in FIG. 4.

Figure 5:
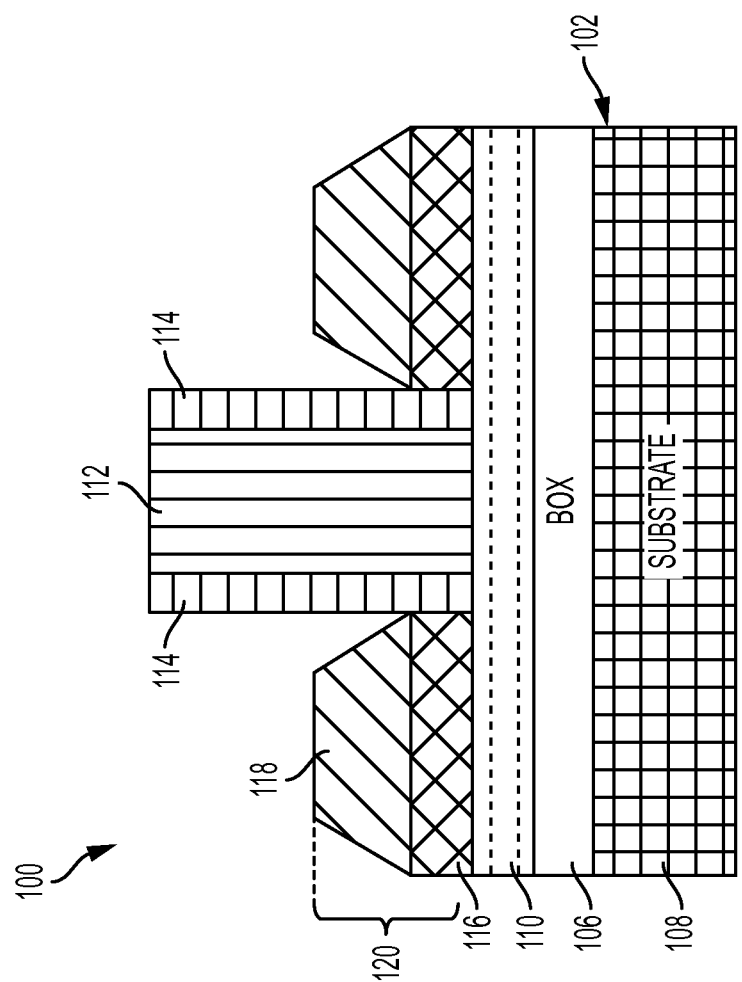

Referring to FIG. 5, second conductive layers 118 are formed on an upper surface of the first conductive layers 116. According to a non-limiting embodiment, each second conductive layer 118 is an in-situ doped heterojunction material such as, for example, SiGe, and is epitaxially grown from the upper surfaces of the first conductive layers 116, respectively. The epitaxy process used to grow the second conductive layers 118 may be carried out using various techniques including, but not limited to, chemical vapor deposition (CVD), vapor phase epitaxy (VPE), molecular beam epitaxy (MBE) or liquid phase epitaxy (LPE) with a gaseous or liquid precursor, such as, for example, silicon tetrachloride. As described above, the second conductive layers 118 are not formed on the gate stack 112 or the spacers 114 since the epitaxy process interacts only with semiconductor material.

The thickness (i.e., vertical height) of the second conductive layer 118 ranges from approximately 10 nm to approximately 30 nm. In cases where a p-type semiconductor device (e.g., pFET) is fabricated, SiGe in-situ doped with boron (B), for example, is epitaxially grown atop the first conductive layers 116 to form the second conductive layers. The boron concentration of the second conductive layer 118 ranges, for example, from $1\times10^{19}/cm^3$ to $2\times10^{21}/cm^3$. In cases where an n-type semiconductor device (e.g., NFET) is fabricated, Si in-situ doped with phosphorus (P), for example, is epitaxially grown atop the first conductive layers 116 to form the second conductive layers 118. The phosphorus concentration of the second conductive layer 118 ranges, for example, from $1\times10^{19}/cm^3$ to $2\times10/cm^3$. According to a non-limiting embodiment, the second conductive layers 118 preferably have a facet shape. That is, each second conductive layer 118 begins growth at the upper surface of the first conductive layer 116 and gradually reaches a plateaued upper surface as further illustrated in FIG. 5.

Still referring to FIG. 5, the stacked arrangement of the first conductive layers 116 and the second conductive layers 118 form dual-layer source/drain regions 120. The different materials of the first and second conductive layers 116-118 provide different dopant diffusion rates. When exposed to an anneal process, for example, the diffusion rate of the dopants (e.g., boron) of the first conductive layers 116 diffuse from the Si at a faster rate than the diffusion rate of the dopants (e.g., boron) from the heterojunction material (e.g., SiGe) of the second conductive layers 118. Accordingly, the first conductive layer 116 can serve as a dopant-source for doping the underlying active semiconductor layer 110 located beneath the dual-layer source/drain regions 120. Moreover, the faster diffusion rate of dopants (e.g., boron) provided by the first conductive layers 116 (e.g., Si) results in the formation of a sharp and abrupt (i.e., non-gradient) extension regions (not shown in FIG. 5) within the active semiconductor layer 110 following the anneal process described in greater detail below.

Figure 6:
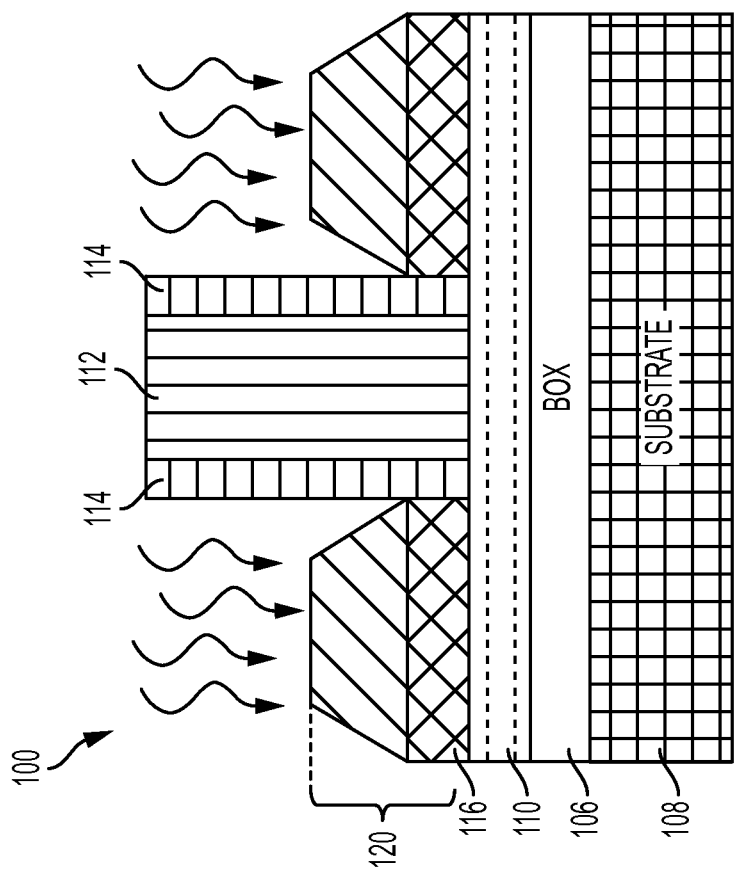

Referring to FIG. 6, the semiconductor device 100 is shown undergoing a thermal anneal process. The anneal process includes exposing the dual-layer source/drain regions 120 to a flash formation anneal process. The flash formation anneal process may generate temperatures ranging from approximately 1000° C. to approximately 1250° C. for approximately 1 milliseconds (ms) to 200 ms. Since the dopants (e.g., boron) diffuses from the pure semiconductor material (e.g., Si) of the first conductive layer 116 at a faster rate than dopants (e.g., boron) diffusing from heterojunction material (e.g., SiGe), the temperature necessary to drive the dopants into the underlying active semiconductor layer 110 is lower compared to conventional semiconductor device utilizing only SiGe raised source/drain regions.

Figure 7:
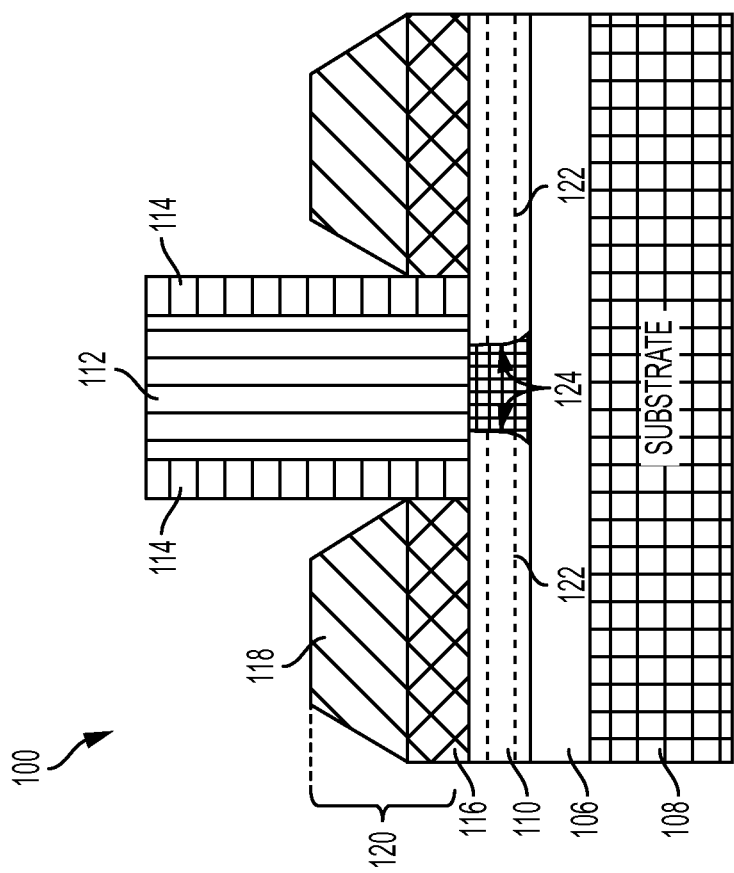

Turning to FIG. 7, the semiconductor device 100 is shown including the formation of extension regions 122 embedded within the active semiconductor layer 110. The extension regions 122 are formed as a result of the aforementioned thermal anneal process which drives dopants (e.g., boron) from the first conductive layers 116 into the active semiconductor layer 110 as understood by one of ordinary skill in the art. Since the dopants (e.g., boron) diffuse from the pure semiconductor material (e.g. Si) of the first conductive layer 116 at a faster rate compared to the diffusion rate of dopants (e.g., boron) from conventional single-layered raised source/drain regions formed of SiGe, low thermal budget (low temperature and/or short annealing time) is sufficient to form the extension. As a results, the extension regions are formed with a sharp and abrupt (i.e., non-gradient: dopant gradient is less than 5 nm/decade) profile. For instance, the diffusion rate of boron from the first conductive layer 116 is about 1.5 to 5 times of the diffusion rate of boron from SiGe.

The resulting sharp and abrupt extension region profile of the extension regions 122 is defined by the uniform junctions 124 that are located beneath (i.e., overlap) the gate structure 104. According to a non-limiting embodiment, a steep uniform slope and small width defines a sharp or abrupt junction 124. Typical slopes for a sharp and abrupt junction 124 are in the range of approximately 0.5 nm per decade (lateral dopant concentration) to approximately 3 nm per decade (lateral dopant concentration) or any other range in between whether a pFET or an nFET. Typical sharp junction widths are 5 nm to 10 nm or any other range in between.

Figure 8:
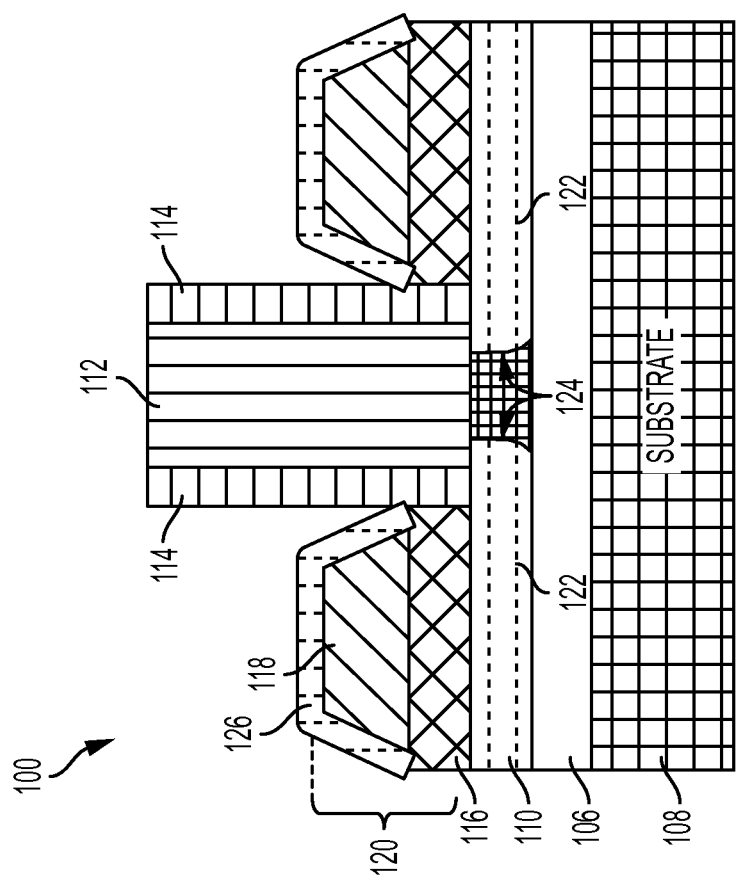

Turning now to FIG. 8, the semiconductor device 100 is illustrated following formation of a thin silicide film 126 atop the second conductive layers 118. According to a non-limiting embodiment, a chemical vapor deposition (CVD) process is performed to deposit the silicide film 126 that conforms to the sidewalls and upper surface of the second conductive layers 118. The silicide film 126 has a thickness ranging from approximately 3 nm to approximately 20 nm. The facet shape of the second conductive layer 118 provides an additional unexpected result in that it reduces the contact resistance of the silicide film 126. Furthermore, the facet shape of the second conductive layer 118 also reduces the parasitic capacitance between the gate conductor and the second conductive layer 118. According to a non-limiting embodiment, the lowered contact resistance may range from approximately $5 \times 10^{-10}$ ohm cm$^2$ to approximately $1 \times 10^{-8}$ ohm cm$^2$. The reduced contact resistance provides various advantages including, but not limited to, reduced Schottky barrier characteristics, increased equilibrium dopant incorporation and activation in the second conductive layers 118 (e.g., the SiGe material) due to the strain compensation effect, and increased contact area. Since the extension is formed by diffusing dopants primarily from the first conductive epitaxy layer, dopants in the second conductive layer remain substantially in the second conductive layer. High dopant concentration reduces Schottky barrier height and thus reduces the contact resistance. In addition, the increased contact area due to the facet epitaxy profile further reduces contact resistance.

Figure 9B:
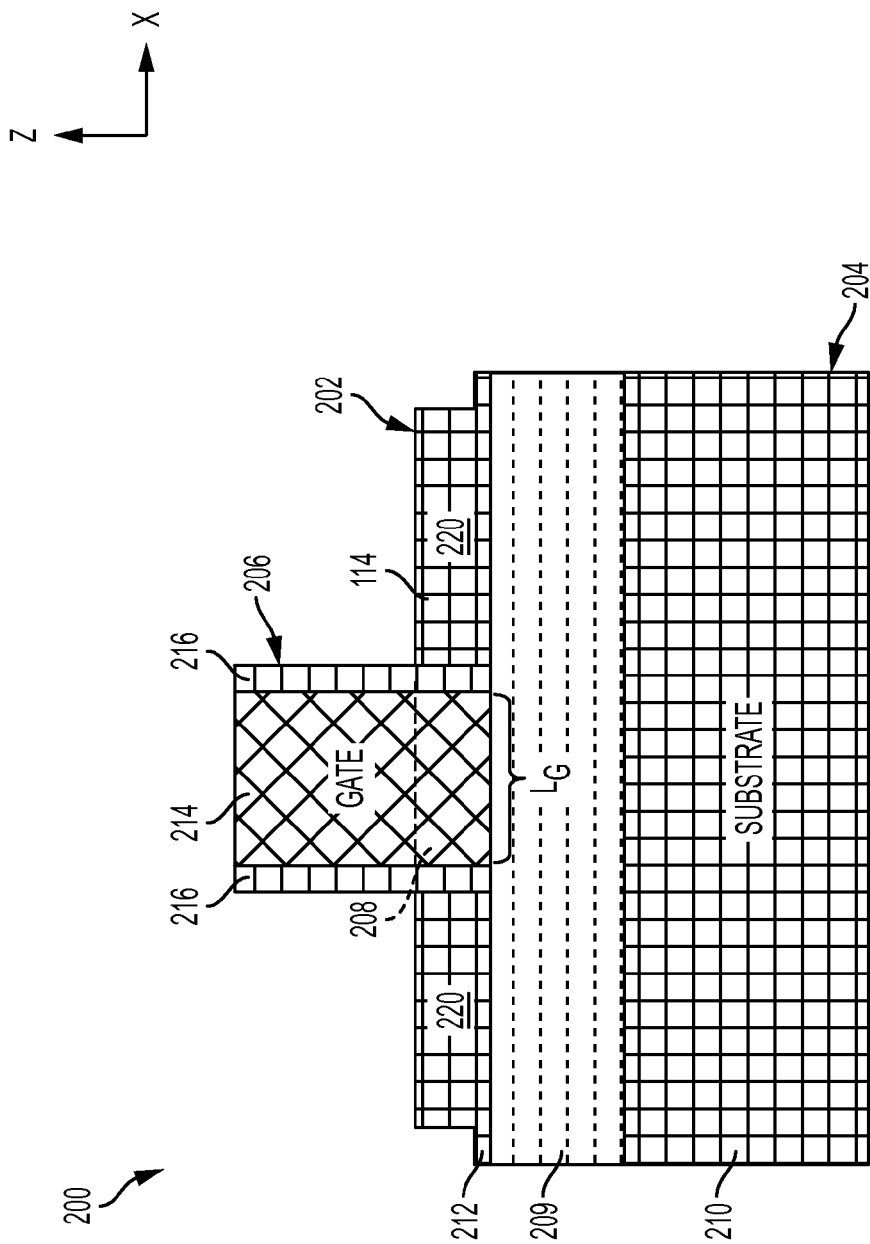
FIG. 9B is a cross-sectional view taken along line A-A' of the fin-type semiconductor device shown in FIG. 9A.

Turning now to FIGS. 9A-15, a process flow for fabricating a fin-type FET (i.e., FinFET) device including a dual-layer source/drain region is illustrated according to a non-limiting embodiment. With reference to FIGS. 9A-9B, an intermediate FinFET 200 is illustrated according to a non-limiting embodiment. The FinFET 200 includes one or more semiconductor fins 202 formed atop a SOI substrate 204, and a gate structure 206 that wraps around the channel region 208 of the fins 202.

The SOI substrate 204 extends along a first axis (e.g., X-axis) to define a length, a second axis (e.g., Y axis) to define a width, and a third axis (Z-axis) to define a height. The SOI substrate 204 includes a buried insulator layer 209 interposed between a bulk substrate layer 210 and the fin 202. The buried insulator layer 209 includes a buried oxide (BOX) layer formed from, for example, silicon dioxide (SiO$_2$) or any other suitable dielectric materials. The thickness of the buried insulator layer 209 ranges, for example, from approximately 5 nanometers (nm) to approximately 200 nm. The bulk substrate layer 210 and the active semiconductor layer 212 are each formed from a semiconductor material such as Si, for example.

The active semiconductor layer 212 may include an semiconductor-on-insulator layer 212 having a thickness ranging, for example, from approximately 10 nm to approximately 100 nm. The semiconductor fins 202 are formed according to various masking and patterning techniques. For example, a sidewall image transfer (SIT) process may performed which transfers a fin pattern into an active semiconductor layer (not shown in FIGS. 9A-9B) originally formed atop the buried insulator layer 209 of the SOI substrate 204. The semiconductor fins 202 extend along the X-axis to define a fin length, the Y-axis to define a fin width, and the Z-axis to define a fin height. The fin width ranges from approximately 3 nm to approximately 30 nm, the fin length ranges from approximately 50 nm to approximately 3000 nm, and the fin height ranges from ranges from approximately 10 nm to approximately 100 nm. The pitch between each fin 202 may range, for example, from approximately 10 nm to approximately 100 nm.

The gate structure 206 includes a gate stack 214 and spacers 216 formed on opposing sidewalls of the gate stack 206. The gate stack 214 is formed from various gate materials including, but not limited to, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate material 214 may further comprise dopants that are incorporated during or after deposition.

Various patterning techniques may be performed to form the gate stack 214. For instance, a hard mask layer (not shown) may be initially deposited on an upper surface of the active semiconductor layer 212 so as to cover the fins. Thereafter, the hardmask layer may be etched selectively with respect to the semiconductor material of the fins 202 to form a gate trench (not shown) in the hardmask layer that exposes a portion of the fins 202. The portion of the fins 202 exposed by the gate trench defines the respective channel region 208. The gate trench may then be filled with a gate material 214, and the hardmask layer subsequently removed to form the gate stack 214 to form the gate stack 214 which wraps around the sidewalls and the upper surface (i.e., the channel region 208) of the fins 202. In addition, exposed active regions 220 of the fins 202 located at opposing sides of the gate structure 206 are reserved to support dual-layer source/drain regions as discussed in greater detail below.

Figure 9C:
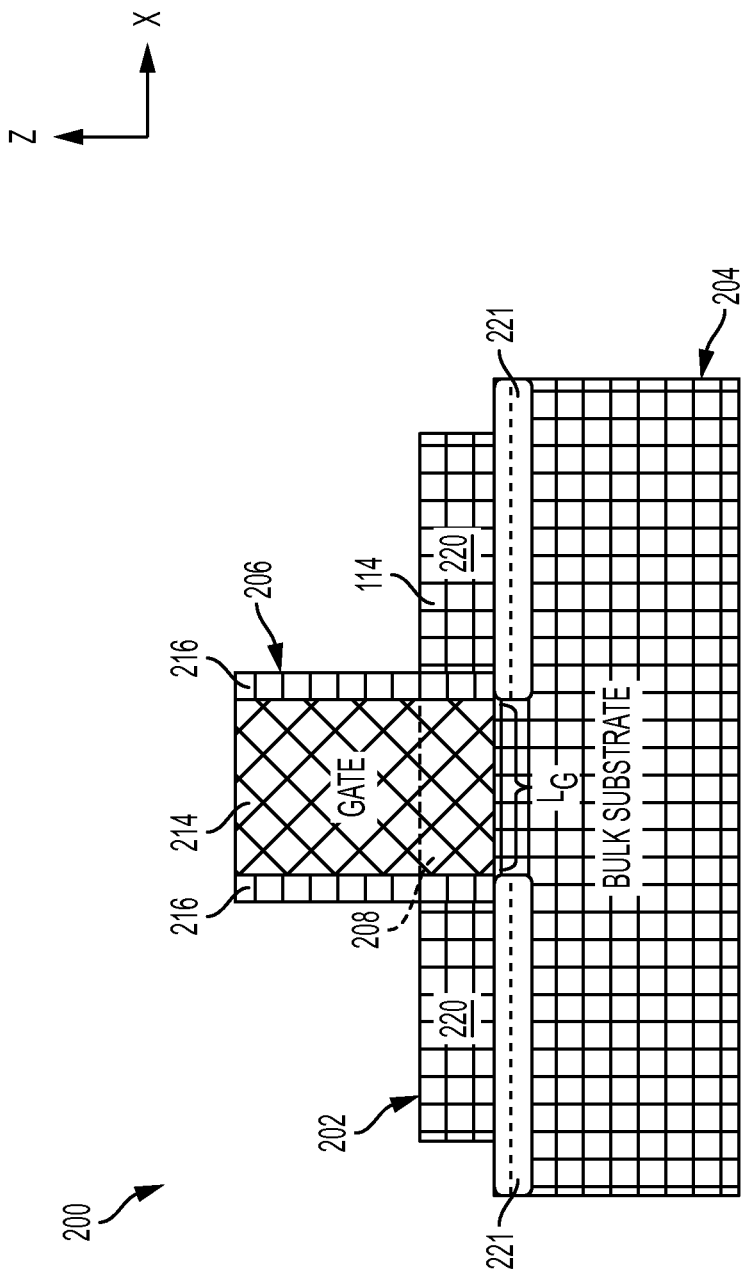
FIG. 9C is a cross-sectional view of a fin-type semiconductor device including a semiconductor fin formed on a bulk substrate according to another non-limiting embodiment.

Although a SOI FinFET 200 is described above, it should be appreciated that a bulk FinFET 200 may utilized without departing from the scope of the present inventive teachings. In this case, one or more semiconductor fins 202 are formed atop a bulk substrate 204 as illustrated in FIG. 9C. Thereafter, a gate structure 206 as described in detail above is formed on an upper surface of the bulk substrate 204. The gate structure 206 wraps around sidewalls and an upper surface of the fin 202 as further illustrated in FIG. 9C. In cases where a bulk substrate 204 is implemented, one or more shallow trench isolation (STI) regions 221 may be formed in the bulk substrate 204 to reduce punchthrough as further illustrated in FIG. 9C.

Figure 10:
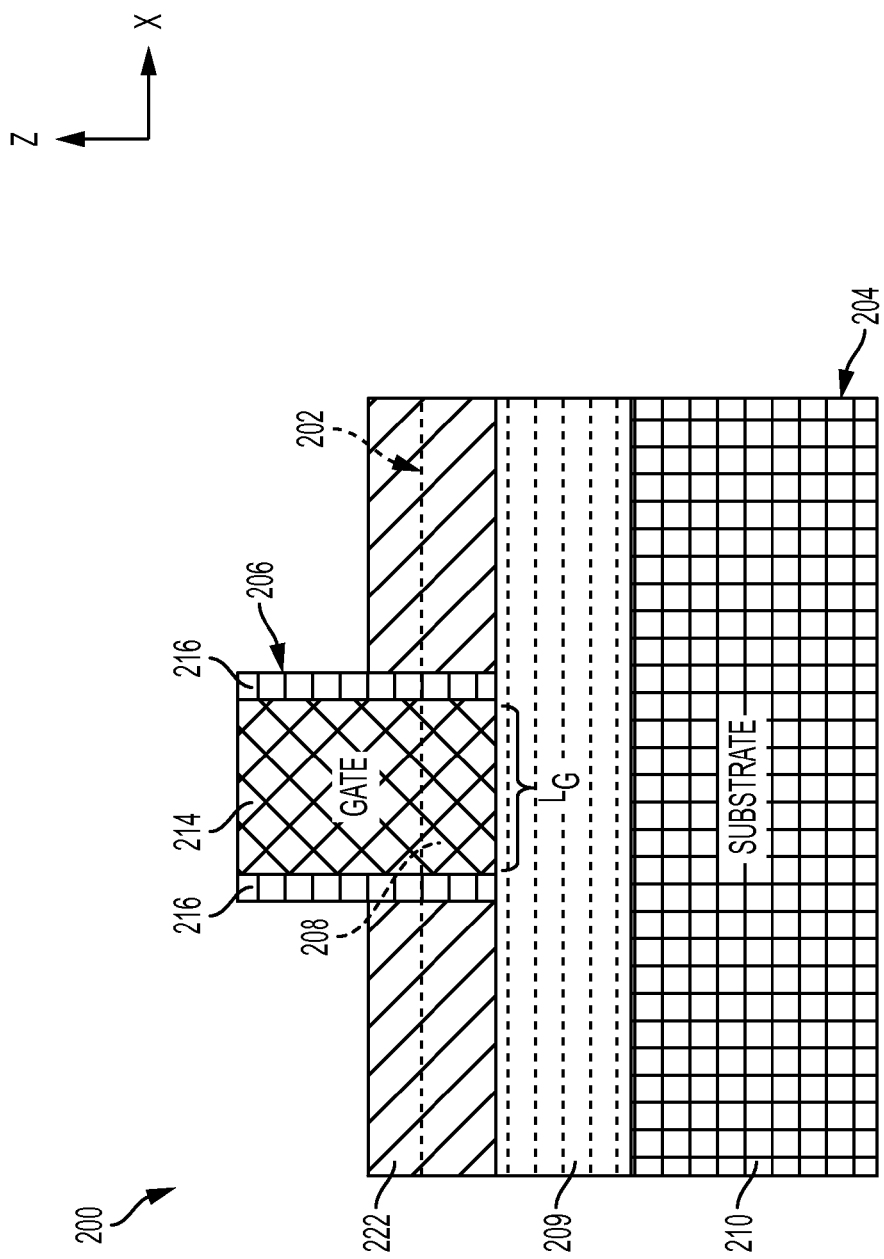

Turning to FIG. 10, the SOI FinFET 200 is illustrated following a first epitaxy process to grow a first conductive layer 222 from the exposed active regions 220 of the fins 202. The exposed active regions 220 are reserved for the formation of dual-layer source/drain regions as discussed in greater detail below. Each first conductive layer 222 is an in-situ doped semiconductor material, and is epitaxially grown from the exposed upper surfaces of the exposed active regions 220. When fabricating a p-type semiconductor device (e.g., pFET), in-situ doped silicon (Si) is epitaxially grown from the exposed active regions 220. When fabricating an n-type semiconductor device (e.g., nFET), in-situ doped silicon germanium (SiGe) is epitaxially grown from the exposed active regions 220. The epitaxy process used to grow the first conductive layers 222 may be carried out using various techniques including, but not limited to, chemical vapor deposition (CVD), vapor phase epitaxy (VPE), molecular beam epitaxy (MBE) or liquid phase epitaxy (LPE) with a gaseous or liquid precursor, such as, for example, silicon tetrachloride. Since the epitaxy process interacts only with semiconductor material, the first conductive layers 222 are not formed on the gate stack 214 or the spacers 216 as understood by one of ordinary skill in the art.

The thickness of the first conductive layer 222 formed on the outer surfaces of the fin 202 ranges from approximately 3 nm to approximately 15 nm. In cases where a pFET is fabricated, Si in-situ doped with boron (B), for example, is epitaxially grown from the active semiconductor layer 110 as boron diffuses from Si faster than from SiGe. The boron concentration of the first conductive layer 116 ranges, for example, from $1\times10^{19}/cm^3$ to $2\times10^{21}/cm^3$. In cases where an nFET is fabricated, SiGe in-situ doped with phosphorus (P) or arsenic (As), for example, is epitaxially grown from the exposed active regions 220 as both P and As diffused from SiGe faster than from Si. The phosphorus concentration of the first conductive layers 222 ranges, for example, from $1\times10^{19}/cm^3$ to $2\times10^{21}/cm^3$. According to a non-limiting embodiment, the first conductive layer 116 preferably has a flat and uniform upper surface.

Figure 11B:
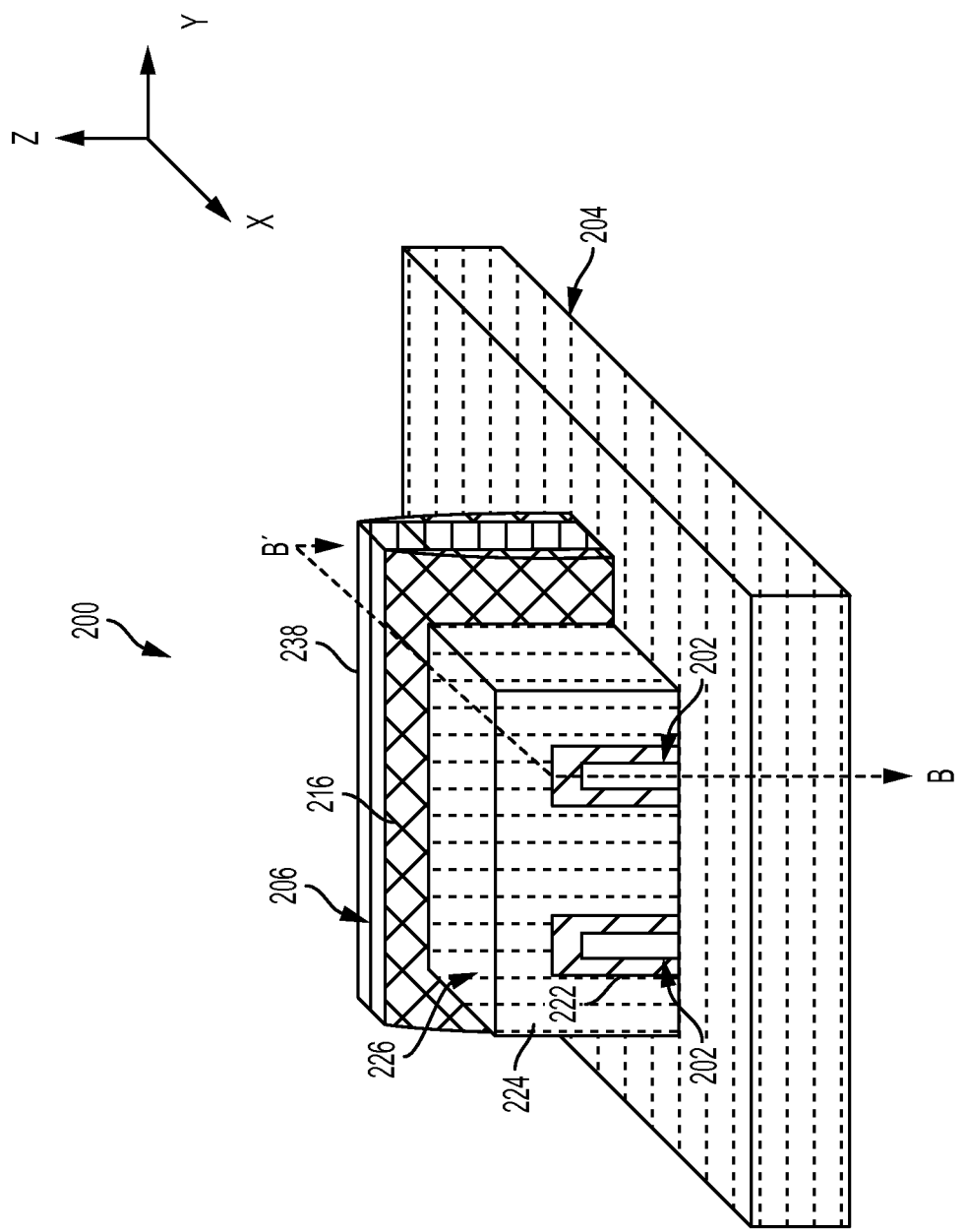
FIG. 11B is a perspective view of the fin-type semiconductor device illustrated in FIG. 11A.
Figure 11C:
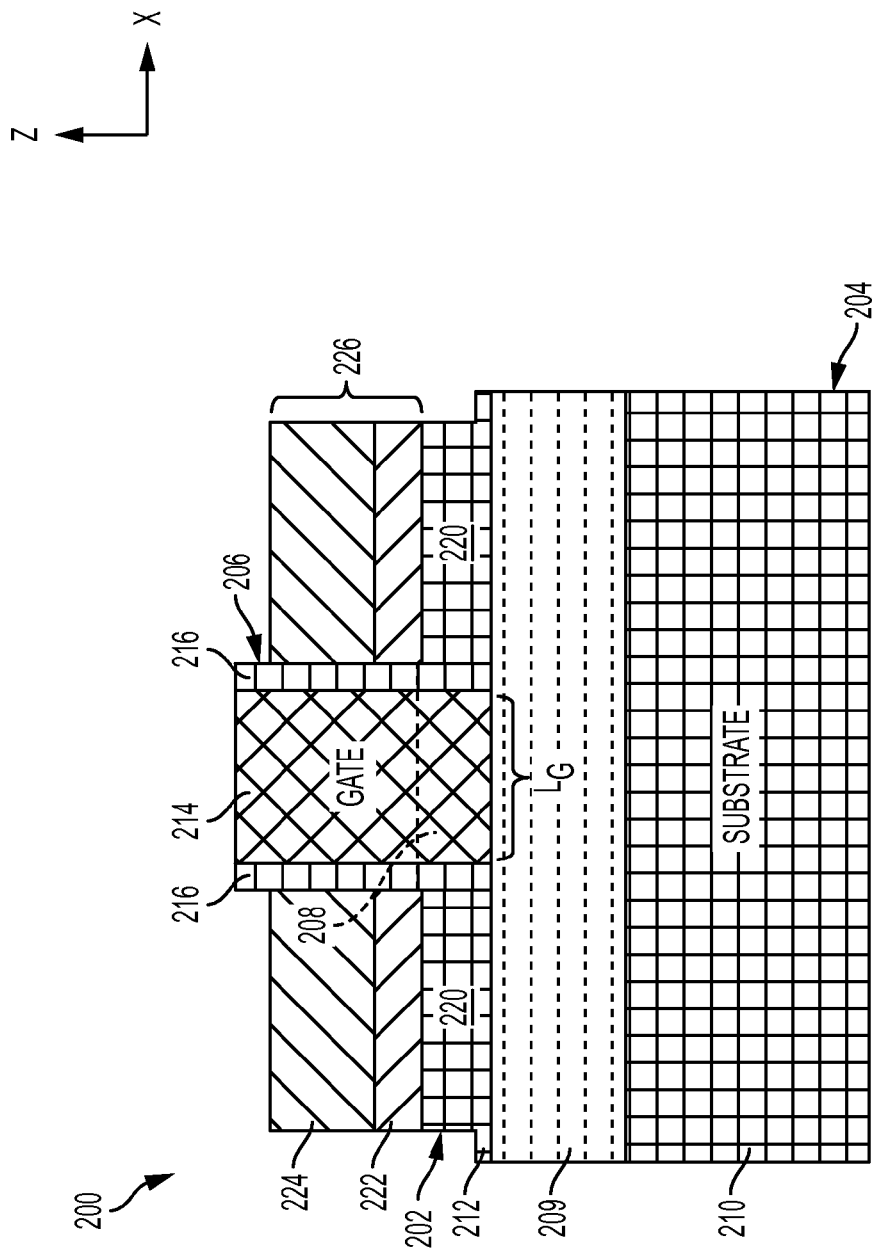
FIG. 11C is a second cross-sectional orientation of the fin-type semiconductor device shown in FIG. 11A taken along line B-B.

Referring to FIG. 11, second conductive layers 224 are formed on an upper surface and the sidewalls of the first conductive layers 222. In this manner, each first conductive layer 222 is interposed between a respective second conductive layer 224 and the fin 202. When forming a pFET, each second conductive layer 224 is an in-situ doped heterojunction material such as, for example, SiGe, and is epitaxially grown from the upper surfaces of the first conductive layers 222, respectively. When forming an nFET, each second conductive layer 224 is an in-situ doped pure semiconductor material such as, for example, Si, and is epitaxially grown from the upper surfaces of the first conductive layers 222, respectively. The epitaxy process used to grow the second conductive layers 224 may be carried out using various techniques including, but not limited to, vapor phase epitaxy (VPE), molecular beam epitaxy (MBE) or liquid phase epitaxy (LPE) with a gaseous or liquid precursor, such as, for example, silicon tetrachloride. As described above, the second conductive layers 224 are not formed on the gate stack 214 or the spacers 216 since the epitaxy process interacts only with semiconductor material.

The thickness of the second conductive layer 224 on the outer surfaces of the first conductive layers 222 ranges from approximately 10 nm to approximately 30 nm. In cases where a p-type semiconductor device (e.g., pFET) is fabricated, SiGe in-situ doped with boron (B), for example, is epitaxially grown atop the first conductive layers 116 to form the second conductive layers. The dopant concentration of the second conductive layer 224 ranges, for example, from $1\times10^{19}/cm^3$ to $2\times10^{21}/cm^3$. In cases where an n-type semiconductor device (e.g., NFET) is fabricated, Si in-situ doped with phosphorus (P), for example, is epitaxially grown atop the first conductive layers 222 to form the second conductive layers 224. Although the second conductive layer 224 is shown as having a flat surface extending from the gate spacers to the end of the substrate 204, it should be appreciated that the second conductive layers 224 may have a facet shape. That is, each second conductive layer 224 may begin growth at the upper surface of the first conductive layer 222 and gradually reaches a plateaued upper surface.

Still referring to FIG. 11, the stacked arrangement of the first conductive layers 222 and the second conductive layers 224 form dual-layer source/drain regions 226. The different materials of the first and second conductive layers 222-224 provide different dopant diffusion rates. When exposed to an anneal process, for example, the diffusion rate of the dopants (e.g., boron) of the first conductive layers 222 diffuse from the dopants (e.g., Si) at a faster rate than the diffusion rate of the dopants (e.g., boron) from the heterojunction material (e.g., SiGe) of the second conductive layers 224. Accordingly, the first conductive layer 222 can serve as a dopant-source for doping the underlying active regions (not shown in FIG. 11) of the fin 202 located beneath the dual-layer source/drain regions 226. Moreover, the faster diffusion rate of dopants (e.g., boron) provided by the first conductive layers 222 (e.g., the Si) results in the formation of a sharp and abrupt (i.e., non-gradient) extension regions (not shown in FIG. 11) within the active regions of the fin 202 following the anneal process described in greater detail below.

Figure 12:
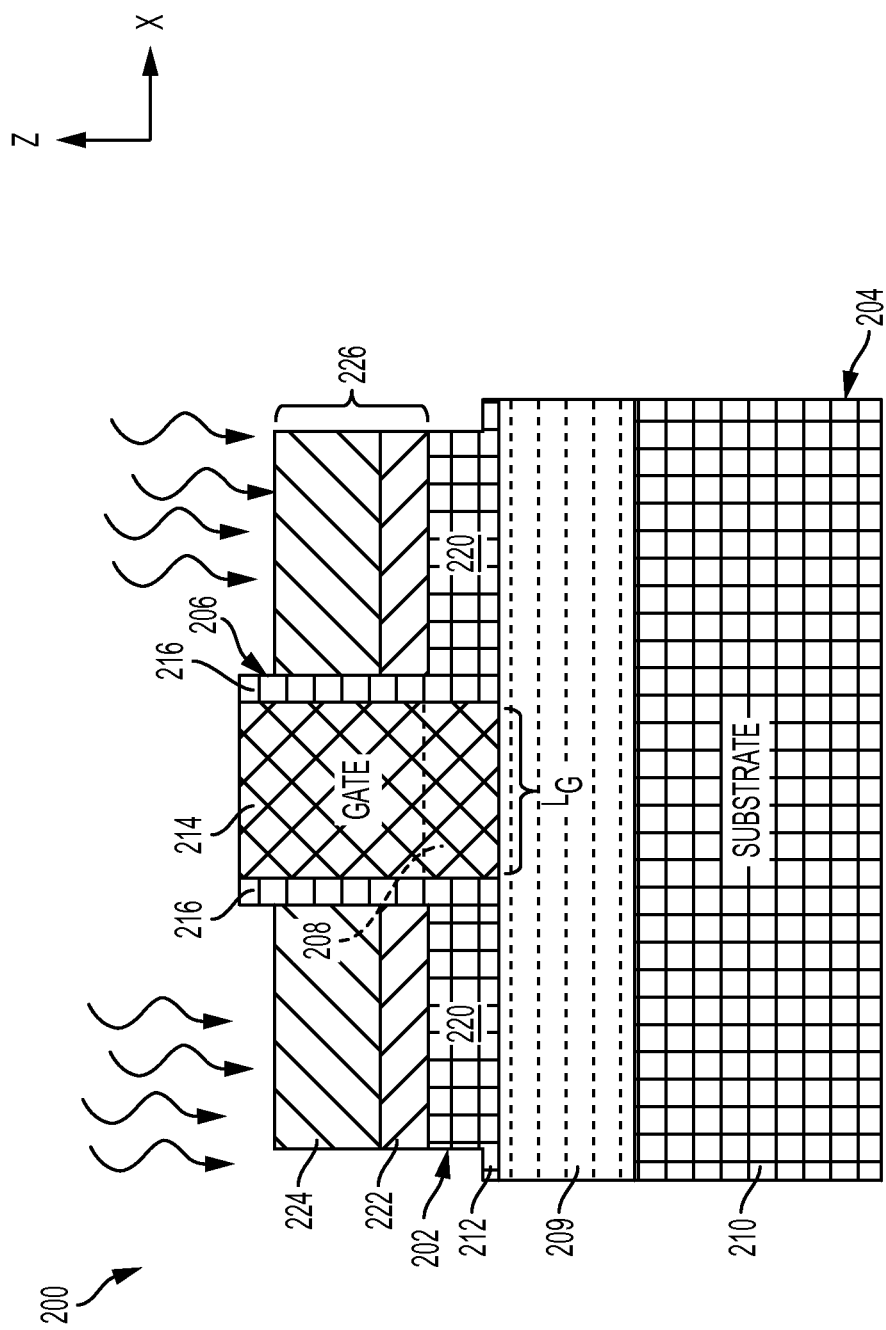

Referring to FIG. 12, the SOI FinFET 200 is shown undergoing a thermal anneal process. The anneal process includes exposing the dual-layer source/drain regions 226 to a flash formation anneal process. The flash formation anneal process may generate temperatures ranging from approximately 1000° C. to approximately 1250° C. for approximately 1 ms to approximately 200 ms. Since the dopants (e.g., boron) diffuses from the pure semiconductor material (e.g., Si) of the first conductive layer 222 at a faster rate than dopants (e.g. boron) diffusing from the heterojunction material (e.g., SiGe), the temperature necessary to drive the dopants into the underlying active regions 220 is lower compared to conventional semiconductor device utilizing only SiGe raised source/drain regions.

Figure 13A:
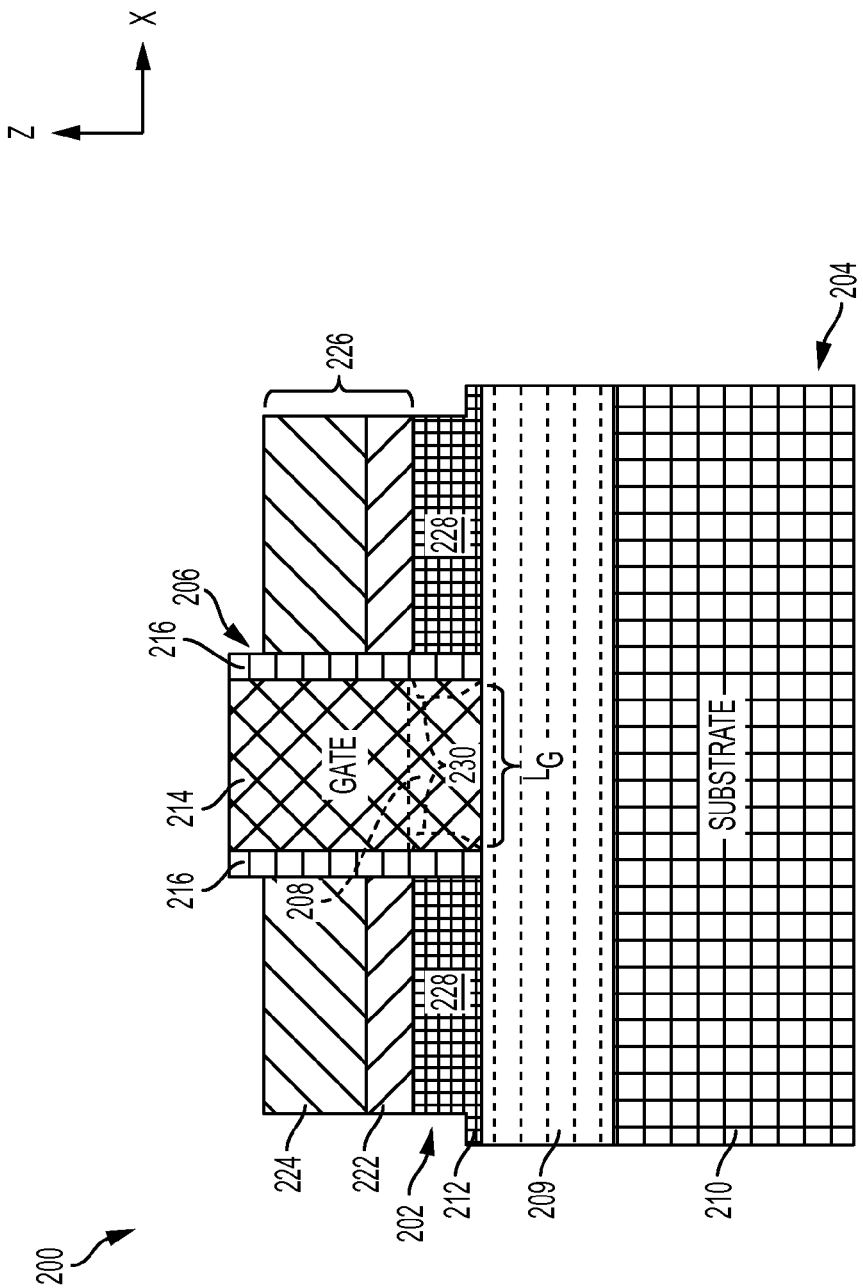
FIG. 13A illustrates the SOI fin-type semiconductor device of FIG. 12 in the second cross-sectional orientation following diffusion of the first conductive layer dopants into the active regions of the semiconductor fins.
Figure 13B:
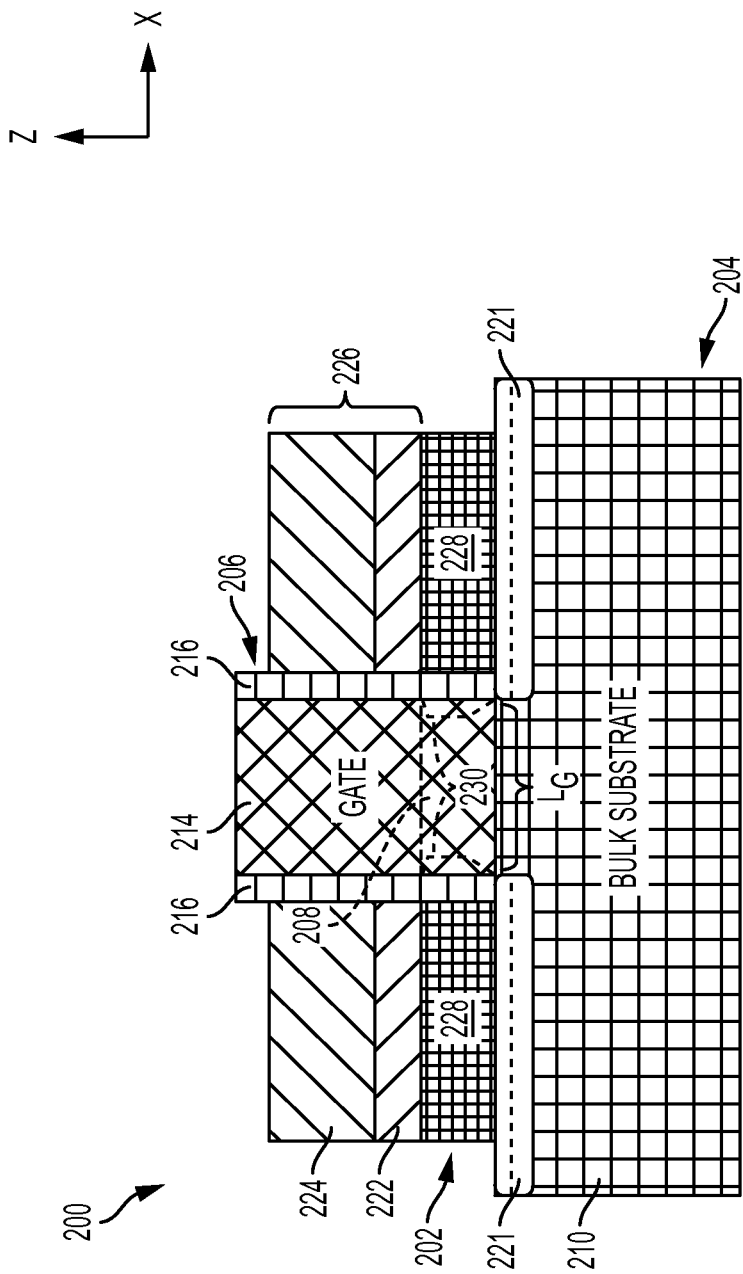
FIG. 13B illustrates a bulk fin-type semiconductor device in the second cross-sectional orientation following diffusion of the first conductive layer dopants into the active regions to form extension regions having sharp and abrupt junctions in the bulk substrate that extend beneath the gate structure.

Turning to FIG. 13A, the SOI semiconductor device 200 is shown following diffusion of dopants from the first conductive layers 222 into the underlying active regions 220 of the fins 202. According to a non-limiting embodiment, the dopants may form extension regions 228 that partially extend beyond the gate spacers 216 as further illustrated in FIG. 13A. In a similar manner, a thermal anneal process can be applied to a bulk FinFET 200 as illustrated in FIG. 13B. In this case, the thermal anneal process drives the dopants (e.g., boron ions) from the first conductive layers 222 into the active regions 228 as understood by one of ordinary skill in the art.

In either case, a low thermal budget (low temperature and/or short annealing time) is sufficient to form extension regions 228 in the bulk substrate 204 since the dopants (e.g., boron) diffuse from the pure semiconductor material (e.g. Si) of the first conductive layer 222 at a faster rate, compared to the diffusion rate of dopants (e.g., boron) from conventional single-layered raised source/drain regions formed of SiGe. For instance, the diffusion rate of boron from the first conductive layer 222 is about 1.5 to 5 times of the diffusion rate of boron from SiGe. Accordingly, the resulting extension regions 228 are formed with a sharp and abrupt (i.e., non-gradient) profile as further illustrated in FIGS. 13A-13B. The resulting sharp and abrupt extension region profile of each extension region 228 is defined by the uniform junctions 230 that are located beneath (i.e., overlap) the gate structure 206 as further illustrated in FIG. 13B. According to a non-limiting embodiment, a steep uniform slope and small width defines a sharp, abrupt junction 230. A slop defining the sharp and abrupt junction 230 ranges from approximately 0.5 nm per decade (lateral dopant concentration) to approximately 3 nm per decade (lateral dopant concentration) or any other range in between whether a pFET or an nFET. Typical sharp junction widths are about 5 nm to about 10 nm or any other range in between.

Figure 14:
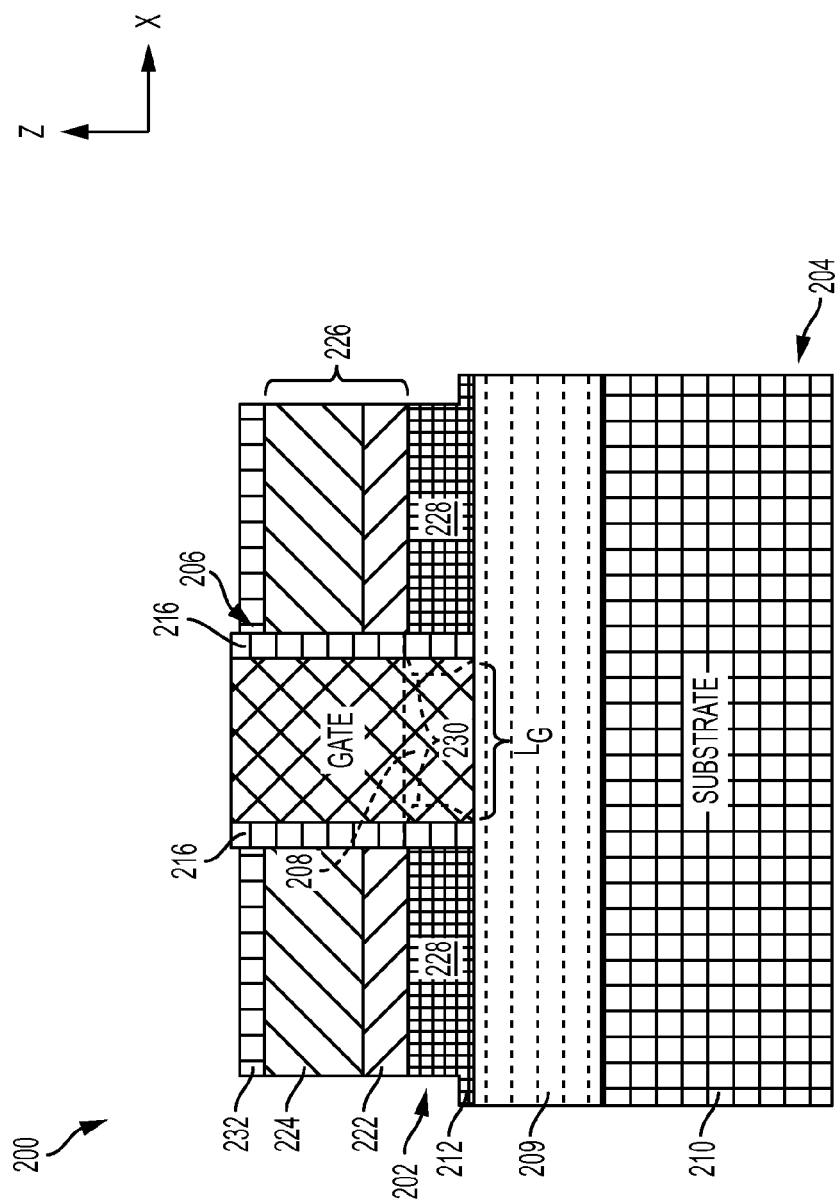

Referring now to FIG. 14, the SOI FinFET 200 is illustrated following formation of a thin silicide film 232 atop the second conductive layers 224. According to a non-limiting embodiment, a chemical vapor deposition (CVD) process is performed to deposit the silicide film 232 that conforms to the sidewalls and upper surface of the second conductive layers 118. The silicide film 232 has a thickness ranging from approximately 1.5 nm to approximately 20 nm. Since the extension is formed by diffusing dopants primarily from the first conductive epitaxy layer, dopants in the second conductive layer remain substantially in the second conductive layer resulting in higher dopant concentrations. The high dopant concentration reduces Schottky barrier height and thus reduces the contact resistance.

Figure 15:
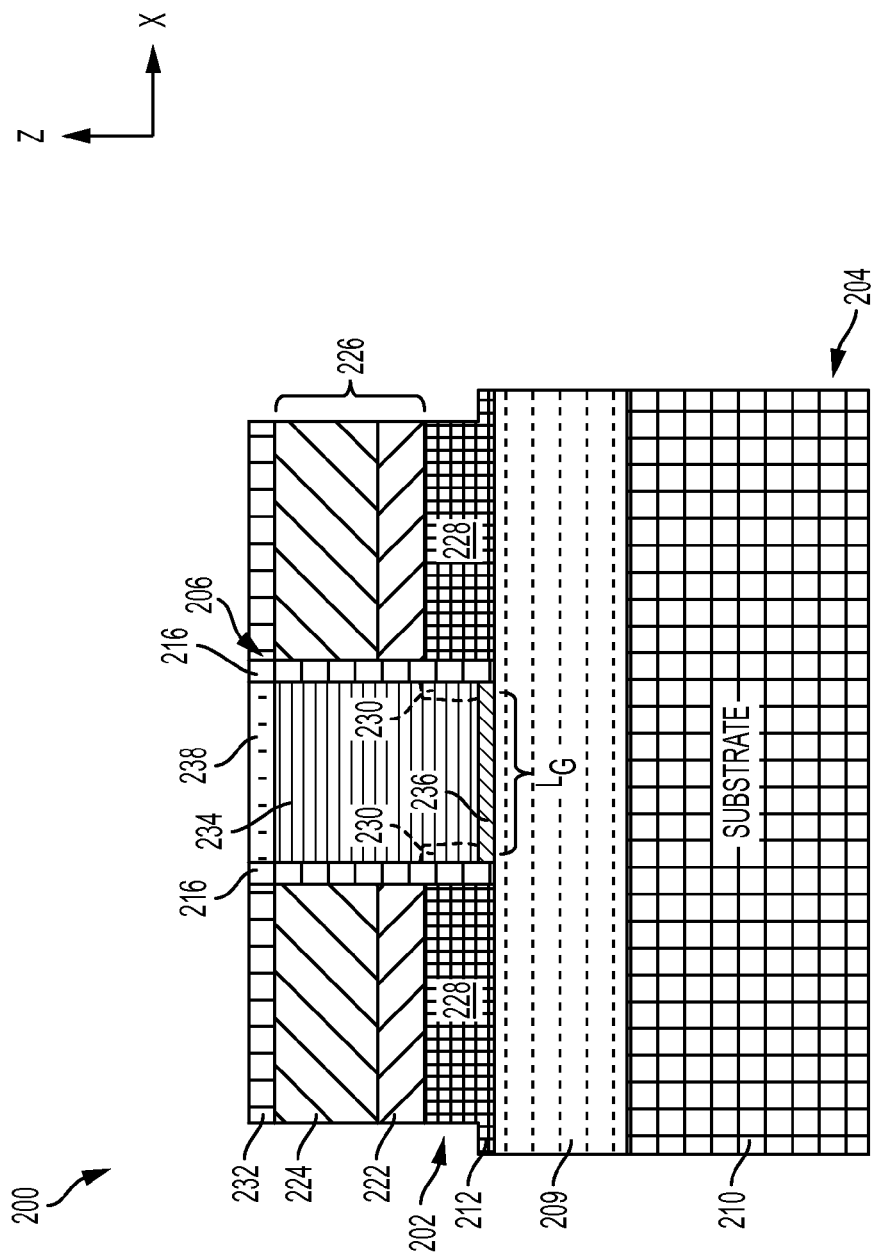

Turning to FIG. 15, the SOI FinFET is illustrated following a replacement metal gate (RMG) process. The RMG process replaces the gate stack 214 with a conductive gate stack 234 which includes a gate dielectric layer 236. The gate dielectric layer 236 is formed of a high-k material such as hafnium oxide ($HfO_2$), for example, and can be deposited using, for example, a CVD process. In this manner, the gate dielectric layer 236 is interposed between the conductive gate stack 234 and the semiconductor substrate. According to an embodiment, a gate cap 238 formed of silicon nitride (SiN), for example, is formed on an upper surface of the conductive gate stack 234. Accordingly, it should be appreciated that a final gate structure 206 may include the gate dielectric layer 236, the conductive gate stack 234, the gate cap 238 and the spacers 216.

Figure 16:
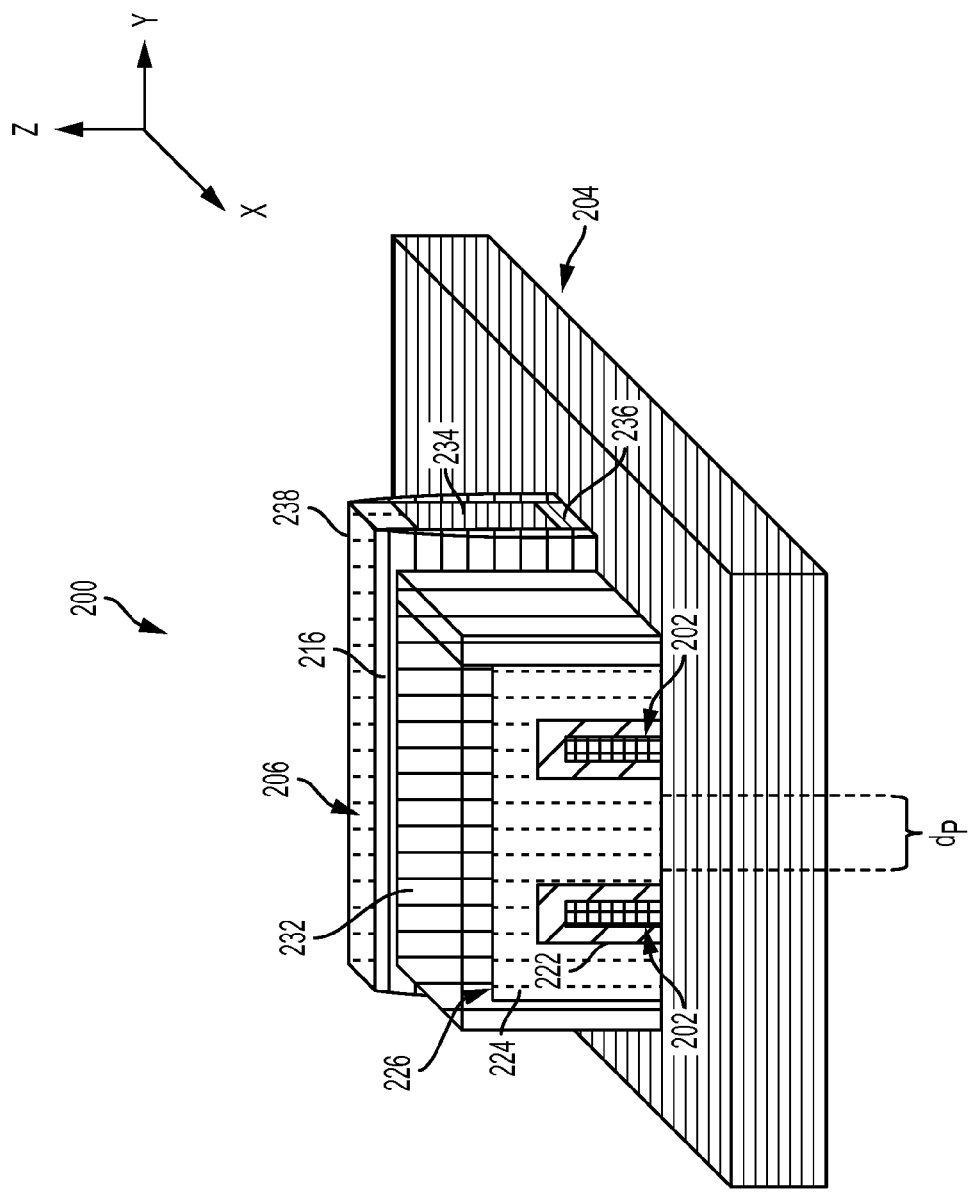
FIG. 16 is a perspective view of a final fin-type semiconductor device after performing a process flow according to a non-limiting embodiment of the invention.

Turning now to FIG. 16, a perspective view of a final FinFET 200 after performing a process flow is illustrated according to a non-limiting embodiment. The FinFET 200 includes a plurality of fins separated from one another according to a large fin pitch ($d_P$). According to a non-limiting embodiment, the large fin pitch ranges from approximately 40 nm to approximately 100 nm. In this case, the $d_P$ is large enough such that the first conductive layer 222 formed on each fin are not merged together. That is, the fins 202 are not merged together via the first conductive layer 222.

Figure 17:
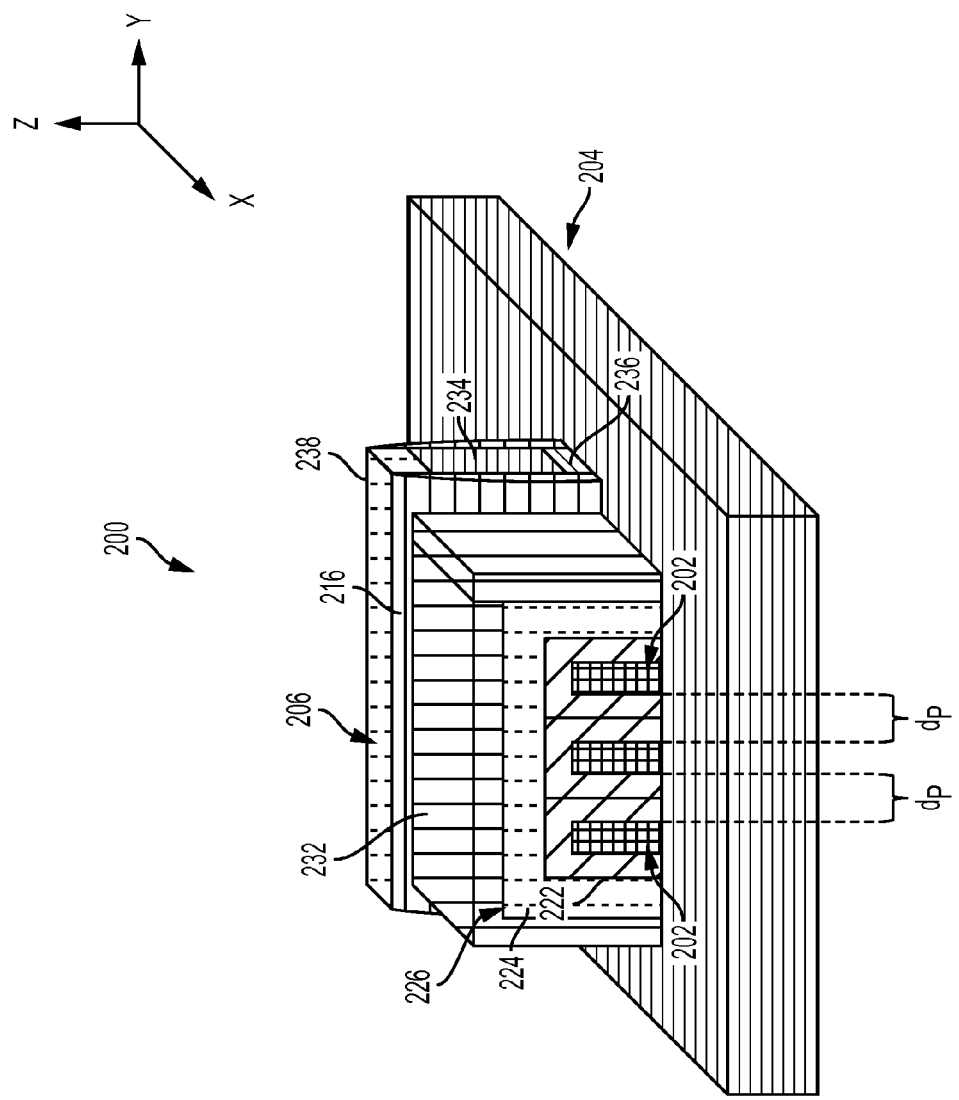
FIG. 17 is a perspective view of another final fin-type semiconductor device after performing a process flow according to a non-limiting embodiment of the invention.

Referring to FIG. 17, a perspective view of a final FinFET 200 after performing a process flow is illustrated according to another non-limiting embodiment. The FinFET 200 of FIG. 17 is similar to the FinFET of FIG. 16, but is formed having a narrow fin pitch ($d_P$). According to a non-limiting embodiment, the narrow fin pitch ranges from approximately 15 nm to approximately 40 nm. In this case, the $d_P$ is narrow enough such that the first conductive layer 222 formed on each fin are merged together as further illustrated in FIG. 17. In this manner, the fins 202 are merged together via the first conductive layer 222.

Accordingly, various embodiments described above provide a semiconductor device including dual-layer source/drain regions. The dual-layer source drain regions include doped lower conductive layers formed atop active semiconductor regions, and a doped upper conductive layer including formed on an upper surface of the first conductive layer. The lower conductive layer is formed of Si, for example, while the upper conductive layer is formed of a heterojunction material such as SiGe. In this manner, the doped lower conductive layer can serve as a dopant-source for doping the underlying active semiconductor regions located beneath the dual-layer source/drain regions. The faster diffusion rate of the dopants (e.g. boron) provided by the lower conductive layer (e.g., Si) results in the formation of a sharp and abrupt (i.e., non-gradient) extension regions within the active semiconductor layer following the anneal process. Accordingly, short-channel control is improved and the source/drain extension resistance is decreased compared to the conventional semiconductor devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a semiconductor device, comprising:
forming a gate structure on an upper surface of a semiconductor substrate, the semiconductor substrate including first and second active regions adjacent to opposing sides of the gate structure;
after forming the gate structure, forming a first dual-layer source/drain region on an upper surface of the first active region, and forming a second dual-layer source/drain region on an upper surface of the second active region, the first and second dual-layer source/drain regions including first dopants therein, wherein forming the first and second dual-layer source/drain regions comprises:
epitaxially growing an in-situ doped semiconductor material from an upper surface of the first and second active regions to form a first conductive layer of the dual-layer source/drain regions; and
epitaxially growing an in-situ doped heterojunction material from an upper surface of the first conductive layer to form a second conductive layer of the dual-layer source/drain regions, the second conductive layer having a facet shape; and
annealing the first and second dual-layer source/drain regions such that the first dopants diffuse into the first and second active regions, respectively, to form first and second extension regions,
wherein the first extension region extends completely beneath the first dual-layer source/drain region and the second extension region extends completely beneath the second dual-layer source/drain region, and the first and second extension regions each have sharp uniform junctions that are overlapped with respect to the gate structure.

2. The method of claim 1, wherein dopants diffuse from the first conductive layer into the first and second active regions at a diffusion rate that is approximately 1.5 to 5 times faster than a diffusion rate at which dopants diffuse from the second conductive layer so as to form the sharp junctions having a slope of ranging from approximately 0.5 nanometers (nm) per decade to approximately 3 nanometers (nm) per decade.

3. The method of claim 2, wherein the semiconductor material is silicon (Si), the first dopant is boron (B), the heterojunction material is silicon germanium (SiGe), and the second dopant is boron (B).

4. The method of claim 1, further comprising depositing a conformal silicide film so as to line an upper surface of the second conductive layer.

5. A method of forming a finFET, comprising:
forming a semiconductor fin on an upper surface of a semiconductor substrate, the fin including a channel region interposed between first and second active regions;
forming a gate structure atop the semiconductor substrate such that the gate structure wraps around sidewalls and an upper surface of the channel region;
forming first and second dual-layer source/drain regions on an upper surface of the first and second active regions, the first and second dual-layer source/drain regions each including an upper conductive layer comprising a heterojunction material, and a lower conductive layer comprising a semiconductor material interposed between the upper conductive layer and the semiconductor fin, wherein the upper conductive layer completely covers an entire upper surface and sidewalls of the lower conductive layer, and wherein the lower conductive layer is formed after forming the gate structure; and
performing a thermal anneal such that dopants from each lower conductive layer and each upper conductive layer diffuse into the first and second active regions to form first and second extension regions embedded in the first and second active regions, respectively, wherein dopants diffuse from the lower conductive layer into the first and second active regions at a diffusion rate that is approximately 1.5 to 5 times faster than a diffusion rate at which dopants diffuse from the upper conductive layer such that the first and second extension regions are formed with sharp junctions that overlap the gate structure and have a slope of ranging from approximately 0.5 nanometers (nm) per decade to approximately 3 nanometers (nm) per decade,
wherein the first extension region extends completely beneath the first dual-layer source/drain region and the second extension region extends completely beneath the second dual-layer source/drain region.

6. The method of claim 5, wherein forming the first and second dual-layer source/drain regions comprises:
epitaxially growing an in-situ doped pure semiconductor material from surfaces of the first and second active regions to form the lower conductive layer of the dual-layer source/drain regions; and
epitaxially growing an in-situ doped heterojunction material from an upper surface of the lower conductive layer to form the upper conductive layer of the dual-layer source/drain regions.

7. The method of claim 6, wherein the pure semiconductor material is silicon (Si), the first dopant is boron (B), the heterojunction material is silicon germanium (SiGe), and the second dopant is boron (B).

8. The method of claim 7, further comprising depositing a conformal silicide film on an upper surface of the upper conductive layer.

9. The method of claim 8, wherein the silicide film conforms a first angled side of the upper conductive layer, the upper surface of the upper conductive layer, and a second angled side of the upper conductive layer opposite the first angled side so as to reduce the contact resistance of the first and second dual-layer source/drain regions.

* * * * *